United States Patent
Sakaguchi et al.

(10) Patent No.: US 11,560,010 B2
(45) Date of Patent: Jan. 24, 2023

(54) ON-MACHINE DEVELOPMENT-TYPE LITHOGRAPHIC PRINTING PLATE PRECURSOR AND METHOD FOR PRODUCING LITHOGRAPHIC PRINTING PLATE

(71) Applicant: FUJIFILM Corporation, Tokyo (JP)

(72) Inventors: Akira Sakaguchi, Shizuoka (JP); Yuki Sakamoto, Shizuoka (JP); Mitsuhiro Fujita, Shizuoka (JP); Yusuke Namba, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 56 days.

(21) Appl. No.: 16/802,458

(22) Filed: Feb. 26, 2020

(65) Prior Publication Data

US 2020/0189305 A1 Jun. 18, 2020

Related U.S. Application Data

(63) Continuation of application No. PCT/JP2018/031360, filed on Aug. 24, 2018.

(30) Foreign Application Priority Data

| Aug. 30, 2017 | (JP) | JP2017-165908 |
| May 2, 2018 | (JP) | JP2018-088781 |
| Jul. 30, 2018 | (JP) | JP2018-142869 |

(51) Int. Cl.
*B41N 1/08* (2006.01)
*B41C 1/10* (2006.01)

(52) U.S. Cl.
CPC ........... *B41N 1/083* (2013.01); *B41C 1/1008* (2013.01)

(58) Field of Classification Search
CPC ........................................................ G03F 7/00
See application file for complete search history.

(56) References Cited

U.S. PATENT DOCUMENTS

| 6,132,934 A | 10/2000 | Vermeersch et al. |
| 2012/0192742 A1* | 8/2012 | Kurokawa ............. C25D 11/24 101/453 |

(Continued)

FOREIGN PATENT DOCUMENTS

| CN | 102616049 | 8/2012 |
| CN | 104203588 | 12/2014 |

(Continued)

OTHER PUBLICATIONS

Translation of JP2016179592 A (Year: 2022).*

(Continued)

*Primary Examiner* — Chanceity N Robinson
(74) *Attorney, Agent, or Firm* — JCIPRNET

(57) ABSTRACT

An on-machine development lithographic printing plate precursor includes an image-recording layer on an aluminum support having an anode oxide film, wherein an end portion of the lithographic printing plate precursor has a shear droop shape, the image-recording layer contains a compound having a support adsorptive property, having a molecular weight of 1,000 or less, and not having an unsaturated double bond group in a molecule, and a content of the compound is substantially the same in a plane of the image-recording layer.

17 Claims, 1 Drawing Sheet

(56) References Cited

U.S. PATENT DOCUMENTS

| | | | |
|---|---|---|---|
| 2015/0000544 A1* | 1/2015 | Shiraki | B41C 1/1016 |
| | | | 101/451 |
| 2016/0339730 A1* | 11/2016 | Wariishi | B41C 1/10 |
| 2016/0361914 A1 | 12/2016 | Wariishi | |
| 2017/0190167 A1 | 7/2017 | Ooshima et al. | |
| 2017/0197400 A1* | 7/2017 | Wariishi | B41C 1/10 |
| 2017/0320351 A1 | 11/2017 | Wariishi | |
| 2018/0157176 A1* | 6/2018 | Kamiya | G03F 7/029 |
| 2019/0255870 A1 | 8/2019 | Wariishi | |
| 2020/0166846 A1* | 5/2020 | Namba | G03F 7/305 |

FOREIGN PATENT DOCUMENTS

| | | | | |
|---|---|---|---|---|
| CN | 106170396 | | 11/2016 | |
| CN | 106687300 | | 5/2017 | |
| CN | 106715139 | | 5/2017 | |
| CN | 107206827 | | 9/2017 | |
| EP | 2735444 | | 5/2014 | |
| EP | 2735444 A2 * | 5/2014 | | B41C 1/1008 |
| JP | 11286183 A * | 10/1999 | | |
| JP | H11286183 | | 10/1999 | |
| JP | 2004101892 | | 4/2004 | |
| JP | 2012158022 | | 8/2012 | |
| JP | 2014104631 | | 6/2014 | |
| JP | 2016179592 | | 10/2016 | |
| JP | 2016179592 A * | 10/2016 | | |
| JP | 2017019206 | | 1/2017 | |
| WO | 2013145949 | | 10/2013 | |
| WO | WO-2016052443 A1 * | 4/2016 | | B41M 1/06 |

OTHER PUBLICATIONS

"Office Action of China Counterpart Application", dated Dec. 29, 2020, with English translation thereof, pp. 1-21.

"International Search Report (Form PCT/ISA/210) of PCT/JP2018/031360," dated Oct. 16, 2018, with English translation thereof, pp. 1-4.

"Written Opinion of the International Searching Authority (Form PCT/ISA/237) of PCT/JP2018/031360," dated Oct. 16, 2018, with English translation thereof, pp. 1-12.

* cited by examiner

ON-MACHINE DEVELOPMENT-TYPE LITHOGRAPHIC PRINTING PLATE PRECURSOR AND METHOD FOR PRODUCING LITHOGRAPHIC PRINTING PLATE

CROSS REFERENCE TO RELATED APPLICATION

This is a continuation of International Application No. PCT/JP2018/031360 filed on Aug. 24, 2018, and claims priority from Japanese Patent Application No. 2017-165908 filed on Aug. 30, 2017, Japanese Patent Application No. 2018-088781 filed on May 2, 2018, and Japanese Patent Application No. 2018-142869 filed on Jul. 30, 2018, the entire disclosures of which are incorporated herein by reference.

BACKGROUND OF THE INVENTION

1. Field of the Invention

The present invention relates to an on-machine development-type lithographic printing plate precursor and a method for producing a lithographic printing plate.

2. Description of the Related Art

Generally, a lithographic printing plate includes a lipophilic image area that receives ink in a printing process and a hydrophilic non-image area that receives dampening water. Lithographic printing is a method in which the properties of water and oil-based ink that repel each other are used, the lipophilic image area of the lithographic printing plate is used as an ink-receiving portion, the hydrophilic non-image area is used as a dampening water-receiving portion (non-ink-receiving portion), a difference in the adhesive property of ink to the surface of the lithographic printing plate is caused, the ink is inked only in the image area, and then the ink is transferred to a body to be printed such as paper, thereby carrying out printing.

At the moment, in a plate making step of producing a lithographic printing plate from a lithographic printing plate precursor, image-exposure is carried out using a computer to plate (CTP) technology. That is, image-exposure is directly carried out on a lithographic printing plate precursor by means of scanning, exposure, or the like using a laser or a laser diode without using a lith film.

Meanwhile, due to the intensifying interest in the global environment, regarding the plate making of lithographic printing plate precursors, an environmental issue of waste liquid generated by wet processes such as a development process has gathered attention, and accordingly, there have been attempts to simplify or remove the development process. As one of simple development processes, a method called "on-machine development" has been proposed. The on-machine development refers to a method in which, after the image-exposure of a lithographic printing plate precursor, a wet-type development process of the related art is not carried out, and instead, the lithographic printing plate precursor is attached to a printer, and non-image areas in an image-recording layer are removed at the initial phase of an ordinary printing step.

In the case of carrying out printing using a lithographic printing plate, in printing on paper smaller than the size of a printing plate such as an ordinary sheet printer, and an end portion of the printing plate is present at a location outside the paper, and thus the end portion does not have any influence on the printing quality. However, in the case of carrying out continuous printing on roll-shaped paper using a rotary press such as printing of newspaper, the end portion of the printing plate is present in the roll-shaped paper, and thus ink attached to the end portion is transferred to the paper and generates linear contamination (edge contamination), which significantly impairs the product value of printed matters.

For the purpose of suppressing the generation of the edge contamination, JP2017-019206A proposes a laminate of a lithographic printing plate precursor in which hydrophilized regions processed with a hydrophilization component are formed on image-recording layer-side plate surfaces in end portions of two facing side surfaces of the lithographic printing plate precursor having a support and an image-recording layer, and the content per unit area of the hydrophilization component in a region A in the image-recording layer-side plate surface, which occupies 3 mm inward from the end portion of the two facing side surfaces of the lithographic printing plate precursor, is greater than the content per unit area of the hydrophilization component in a region other than the region A by 10 mg/m$^2$ or more.

SUMMARY OF THE INVENTION

In the lithographic printing plate precursor described in JP2017-019206A, in order to suppress the generation of the edge contamination, the content per of the hydrophilization component in the end portion region A is set to be greater than the content of the hydrophilization component in the region other than the region A by 10 mg/m$^2$ or more by means of the application of a coating fluid containing the hydrophilization component or the like.

However, it was found that, in the case of carrying out a hydrophilization process such as the application of the coating fluid containing the hydrophilization component on the end portion region of the lithographic printing plate precursor, a phenomenon of the degradation of an image-forming property in the hydrophilization-processed end portion region occurs. This is considered to be because the hydrophilization process decreases the mechanical strength of the image-recording layer and decreases the adhesive force between the image-recording layer and the support, and thus, during on-machine development, the image-recording layer is not maintained in the end portion region and is removed together with a non-image area.

An object that the present invention attempts to attain is to provide an on-machine development-type lithographic printing plate precursor in which edge contamination is prevented without degrading the characteristics such as the image-forming property of the end portion and on-machine developability and a method for producing a lithographic printing plate in which the on-machine development-type lithographic printing plate precursor is used.

Means for achieving the above-described object will be described below.

(1) An on-machine development-type lithographic printing plate precursor comprising: an image-recording layer on an aluminum support having an anode oxide film, in which an end portion of the lithographic printing plate precursor has a shear droop shape, the image-recording layer contains a compound having a support adsorptive property, having a molecular weight of 1,000 or less, and not having an unsaturated double bond group in a molecule, and a content of the compound is substantially the same in a plane of the image-recording layer.

(2) The on-machine development-type lithographic printing plate precursor according to (1), in which the compound is an oxo acid.

(3) The on-machine development-type lithographic printing plate precursor according to (1) or (2), in which the compound is a compound represented by Formula 1.

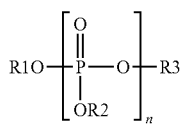

Formula 1

In Formula 1, n represents an integer of 2 to 10, and R1, R2, and R3 each independently represent a hydrogen atom, an alkyl group, or an alkylene oxide group.

(4) The on-machine development-type lithographic printing plate precursor according to any one of (1) to (3), in which the compound is a phosphoric acid, a polyphosphoric acid, a phosphonic acid, or a phosphinic acid.

(5) The on-machine development-type lithographic printing plate precursor according to any one of (1) to (4), in which the content of the compound is 10 to 150 mg/m$^2$.

(6) The on-machine development-type lithographic printing plate precursor according to any one of (1) to (5), in which the shear droop shape has a shear droop amount X of 25 to 150 μm and a shear droop width Y of 70 to 300 μm.

(7) The on-machine development-type lithographic printing plate precursor according to (6), in which an area ratio of a crack present on a surface of the anode oxide film in a region corresponding to the shear droop width Y of the lithographic printing plate precursor is 10% or less.

(8) The on-machine development-type lithographic printing plate precursor according to (7), in which the area ratio of the crack is 6% or less.

(9) The on-machine development-type lithographic printing plate precursor according to any one of (1) to (8), in which the image-recording layer contains a polymer particle.

(10) The on-machine development-type lithographic printing plate precursor according to (9), in which the polymer particle is a particle of a polymer including a monomer unit derived from a styrene compound and/or a monomer unit derived from a (meth)acrylonitrile compound.

(11) The on-machine development-type lithographic printing plate precursor according to any one of (1) to (10), in which the image-recording layer contains a polymerization initiator, an infrared absorber, and a polymerizable compound.

(12) An on-machine development-type lithographic printing plate precursor comprising: an image-recording layer on an aluminum support having an anode oxide film, in which an end portion of the lithographic printing plate precursor has a shear droop shape, the image-recording layer contains a compound having a support adsorptive property, having a molecular weight of 1,000 or less, and not having an unsaturated double bond group in a molecule, a content of the compound is substantially the same in a plane of the image-recording layer, and, in the case of linearly analyzing a cross section of the lithographic printing plate precursor in a depth direction using STEM-EDS, 0.5% by mass or more of an element derived from a support-adsorptive group is present at any depth toward an image-recording layer side from an interface between the aluminum support and the image-recording layer.

(13) The on-machine development-type lithographic printing plate precursor according to any one of (1) to (12), in which a value of brightness L* in a CIEL*a*b* color system of a surface of the anode oxide film on the image-recording layer side is 70 to 100.

(14) The on-machine development-type lithographic printing plate precursor according to any one of (1) to (13), in which a steepness a45 of a component having a wavelength of 0.2 to 2 μm on a surface of the anode oxide film on the image-recording layer side is 30% or less.

(15) The on-machine development-type lithographic printing plate precursor according to any one of (1) to (14), in which micropores are present on a surface of the anode oxide film, and an average diameter of the micropores on the surface of the anode oxide film is 10 to 100 nm.

(16) The on-machine development-type lithographic printing plate precursor according to (15), in which the micropore is constituted of large-diameter pore portions extending up to a location of 10 to 1,000 nm deep from the surface of the anode oxide film and small-diameter pore portions that communicate with a bottom portion of the large-diameter pore portion and extends up to a location of 20 to 2,000 nm deep from a communication location, and an average diameter of the small-diameter pore portions is 5% to 80% of an average diameter of the large-diameter pore portions.

(17) A method for producing a lithographic printing plate comprising: a step of image-exposing the on-machine development-type lithographic printing plate precursor according to any one of (1) to (16) using an infrared laser; and a step of removing a non-exposed portion of the image-recording layer using at least one selected from printing ink or dampening water on a printer.

According to the present invention, it is possible to provide an on-machine development-type lithographic printing plate precursor in which edge contamination is prevented without degrading the characteristics such as the image-forming property of the end portion and on-machine developability and a method for producing a lithographic printing plate in which the on-machine development-type lithographic printing plate precursor is used.

DESCRIPTION OF THE PREFERRED EMBODIMENTS

Figure 1:
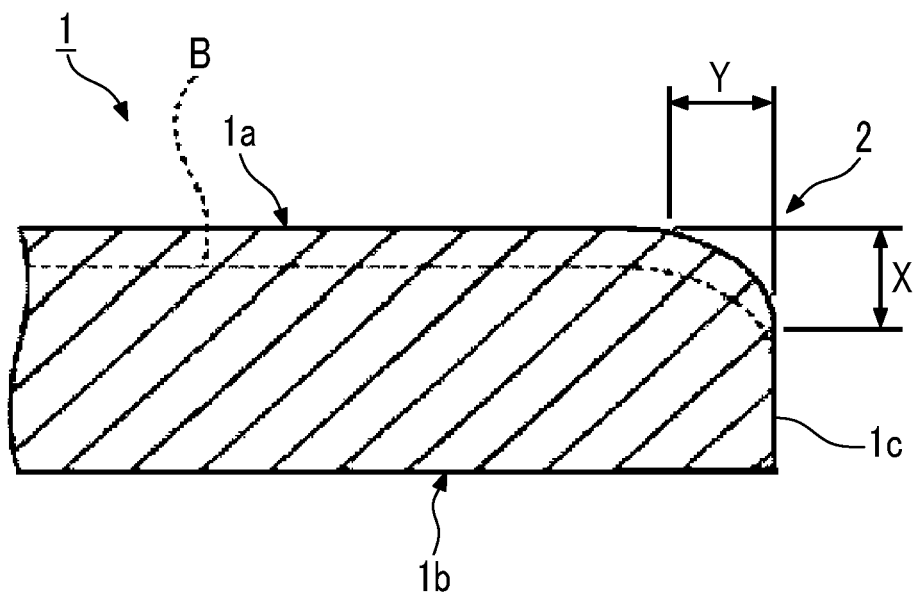
FIG. 1 is a schematic view showing a cross-sectional shape of an end portion of a lithographic printing plate precursor.

Hereinafter, a form for carrying out the invention will be described in detail.

In the present specification, regarding the expression of a group in a compound represented by a formula, in a case in which a group that is not described to be "substituted" or "unsubstituted" is capable of further having a substituent, unless particularly otherwise described, the group refers not only to an unsubstituted group but also to a group having a substituent. For example, in a formula, the expression "R represents an alkyl group, an aryl group, or a heterocyclic group" means that "R represents an unsubstituted alkyl group, a substituted alkyl group, an unsubstituted aryl group, a substituted aryl group, an unsubstituted heterocyclic group, or a substituted heterocyclic group".

In the present specification, the terminology "(meth) acrylate" refers to "at least any of acrylate and methacrylate". The above description will be also true for "a (meth) acryloyl group", "a (meth)acrylic acid", "a (meth)acrylic resin", and the like.

[On-Machine Development-Type Lithographic Printing Plate Precursor]

An on-machine development-type lithographic printing plate precursor of an embodiment of the present invention is an on-machine development-type lithographic printing plate precursor constituted of at least an aluminum support having an anode oxide film and an image-recording layer, an end portion of the lithographic printing plate precursor has a shear droop shape, the image-recording layer contains a compound having a support adsorptive property and having a molecular weight of 1,000 or less, the compound does not have an unsaturated double bond group, and a content of the compound is substantially the same in a plane of the image-recording layer.

[Aluminum Support having Anode Oxide Film]

The aluminum support having an anode oxide film constituting the on-machine development-type lithographic printing plate precursor will be described.

An aluminum plate that is used for the aluminum support is made of a metal containing dimensionally stable aluminum as a main component, that is, aluminum or an aluminum alloy. The aluminum plate is preferably selected from a pure aluminum plate and an alloy plate including aluminum as a main component and a small amount of a different element.

As the different element that is included in the aluminum alloy, there are silicon, iron, manganese, copper, magnesium, chromium, zinc, bismuth, nickel, titanium, and the like. The content of the different element in the alloy is 10% by mass or less. A pure aluminum plate is preferred, but it is difficult to manufacture completely pure aluminum in terms of a smelting technique, and thus the aluminum plate may be an alloy plate slightly containing the different element. The composition of the aluminum plate that is used for the aluminum support is not specified, and it is possible to appropriately use an aluminum plate that has been well known in the related art, for example, JIS A 1050, JIS A 1100, JIS A 3103, JIS A 3005, or the like.

The thickness of the aluminum plate is preferably approximately 0.1 to 0.6 mm.

The anode oxide film refers to an anode aluminum oxide film having extremely fine pores (also referred to as micropores) that are substantially perpendicular to the surface of the film and each uniformly distributed which is formed on a surface of the aluminum plate by an anodization process. The micropores extend in the thickness direction (depth direction) from the surface of the anode oxide film.

In the on-machine development-type lithographic printing plate precursor of the embodiment of the present invention, from the viewpoint of improving image visibility, the brightness being high on the surface of the anode oxide film (a surface on which the image-recording layer is formed) of the aluminum support is useful.

In a step of carrying out printing on a lithographic printing plate, generally, a plate inspection operation is carried out before the plate is attached to a printer for the purpose of confirming whether or not an image is recorded as intended. For the on-machine development-type lithographic printing plate precursor, it becomes necessary to confirm the image in a stage of the on-machine development-type lithographic printing plate precursor being image-exposed, and thus means for generating a so-called print-out image is applied to an image-exposed portion.

As a method for quantitatively evaluating the viewability (image visibility) of an image area in the image-exposed on-machine development-type lithographic printing plate precursor, a method in which the brightness of the image-exposed portion and the brightness of a non-exposed portion are measured and a difference between both brightness values is obtained is exemplified. Here, as the brightness, the value of brightness $L^*$ in the CIEL*a*b* color system can be used, and the brightness can be measured using a chroma meter (Spectro Eye, manufactured by X-Rite Inc.). As the difference between the brightness of the image-exposed portion and the brightness of the non-exposed portion, which are obtained by measurement, increases, it becomes easier to view the image area.

It was clarified that, in order to increase the difference between the brightness of the image-exposed portion and the brightness of the non-exposed portion, the value of the brightness $*L$ in the CIEL*a*b* color system of the surface of the anode oxide film being great is effective. That is, the value of the brightness $*L$ is preferably 70 to 100.

In addition, in the on-machine development-type lithographic printing plate precursor according to the embodiment of the present invention, from the viewpoint of improving an ink contamination-preventing property of a non-image area, the steepness a45 of a component having a wavelength of 0.2 to 2 μm on the surface of the anode oxide film (a surface on which the image-recording layer is formed) in the aluminum support being small is useful.

The steepness a45 of a component having a wavelength of 0.2 to 2 μm is one of factors that indicate the surface shape of the anode oxide film and represents an area ratio of a portion having a slope angle of 45 degrees or more in a component having a wavelength of 0.2 to 2 μm extracted from three-dimensional data obtained from the measurement of the surface of the anode oxide film using an atomic force microscope (AFM).

The steepness a45 of a component having a wavelength of 0.2 to 2 μm can be obtained according to the following sequences (1) to (3).

(1) Measurement of surface shape and acquisition of three-dimensional data

The surface shape of the anode oxide film in the aluminum support is measured and three-dimensional data are obtained using an atomic force microscope.

Specifically, a 1 cm×1 cm-size specimen is cut out from the aluminum support and set in a horizontal specimen table on a piezo scanner, a cantilever is caused to approach to the surface of the specimen, the specimen is scanned in an XY direction at the time of the cantilever reaching a region on which the atomic force is exerted, and, at this time, unevenness of the specimen is captured as the displacement of piezo in a Z direction. As the piezo scanner, a piezo scanner capable of scanning a range extending 150 μm in the XY direction and 10 μm in the Z direction is used. As the cantilever, a cantilever having a resonant frequency of 120 to 150 kHz and a spring constant of 12 to 20 N/m (SI-DF20, manufactured by Nanoprobes, Inc.) is used, and the cantilever is used in a dynamic force mode (DFM) for the measurement. A small slope of the specimen is corrected by the least squares approximation of the obtained three-dimensional data, and a reference surface is obtained.

The measurement is carried out at 512×512 points in a 25×25 μm range on the surface of the specimen, the resolution in the XY direction is set to 1.9 µm, the resolution in the Z direction is set to 1 nm, and the scanning rate is set to 60 µm/sec.

(2) Extraction of component having wavelength of 0.2 to 2 µm

The component is extracted by obtaining a frequency distribution by the fast Fourier transformation of the three-dimensional data obtained in (1), then, selecting the component having a wavelength of 0.2 to 2 µm, and then carrying out Fourier inverse transformation.

This extraction is capable of removing noise that is generated by, in the case of scanning a surface having deep unevenness such as the aluminum support that is used in the lithographic printing plate precursor with an in-depth probe of AFM, the in-depth probe hitting and bouncing from an edge portion of a protrusion portion or a portion of the in-depth probe other than a sharp tip coming into contact with a wall surface of a deep recess portion.

(3) Computation of steepness a45

Three adjacent points are extracted using the three-dimensional data (f(x, y)) obtained in (2), an angle formed by a fine triangle formed by the three points and the reference surface is computed for all data, and a slope angle distribution curve is obtained. The sum of the areas of the fine triangles is obtained and used as an actual area. The steepness a45 (unit: %) that is a proportion of a portion having a slope angle of 45 degrees or more in the actual area is computed from the slope angle distribution curve.

From the viewpoint of further improving a contamination-preventing property and neglectability, the steepness a45 of a component having a wavelength of 0.2 to 2 µm is preferably 30% or less, more preferably 25% or less, still more preferably 20% or less, and particularly preferably 18% or less. The lower limit is not particularly limited, but is generally 5% or more. In the above-described range, an effect for improving the image visibility is also admitted.

[Method for Manufacturing Aluminum Support]

A method for manufacturing the aluminum support is not particularly limited. As a preferred aspect of the method for manufacturing the aluminum support, a method including a step of carrying out a roughening process on the aluminum plate (roughening process step), a step of anodizing the roughened aluminum plate (anodization process step), and a step of bringing the aluminum plate having an anode oxide film obtained in the anodization process step into contact with an acid aqueous solution or an alkali aqueous solution and enlarging the diameters of micropores in the anode oxide film (pore widening process step) is exemplified.

Hereinafter, the respective steps will be described in detail.

<Roughening Process Step>

The roughening process step is a step of carrying out a roughening process including an electrochemical roughening process on the surface of the aluminum plate. The roughening process step is preferably carried out before the anodization process step described below, but may not be carried out as long as the surface of the aluminum plate already has a preferred surface shape.

As the roughening process, only an electrochemical roughening process may be carried out, but an electrochemical roughening process and a mechanical roughening process and/or a chemical roughening process may be carried out in combination.

In the case of combining a mechanical roughening process and an electrochemical roughening process, the electrochemical roughening process is preferably carried out after the mechanical roughening process.

The electrochemical roughening process is preferably carried out in an aqueous solution of nitric acid or hydrochloric acid.

The mechanical roughening process is generally carried out for the purpose of setting the surface roughness Ra of the surface of the aluminum plate to 0.35 to 1.0 µm.

A variety of conditions for the mechanical roughening process are not particularly limited, but the mechanical roughening process can be carried out according to a method described in, for example, JP1975-040047B (JP-S50-040047B). The mechanical roughening process can be carried out by carrying out a brush grain using a pumice stone suspension or in a transfer mode.

In addition, the chemical roughening process is also not particularly limited and can be carried out according to a well-known method.

After the mechanical roughening process, a chemical etching process below is preferably carried out.

The chemical etching process that is carried out after the mechanical roughening process is carried out in order to smoothen an edge portion of an uneven shape of the surface of the aluminum plate, prevent ink being caught during printing, improve the contamination resistance of lithographic printing plates, and remove an unnecessary substance such as a particle of a polishing material remaining on the surface.

As the chemical etching process, etching by an acid or etching by an alkali is known; however, from the viewpoint of the etching efficiency, as a particularly preferable method, a chemical etching process using an alkali solution (hereinafter, also referred to as the "alkali etching process") is exemplified.

An alkali agent that is used in the alkali solution is not particularly limited, and, for example, sodium hydroxide, caustic potash, sodium metasilicate, sodium carbonate, sodium aluminate, sodium gluconate, and the like are preferably exemplified.

In addition, the alkali agent may contain an aluminum ion. A concentration of the alkali solution is preferably 0.01% by mass or more and more preferably 3% by mass or more, and the concentration is preferably 30% by mass or less and more preferably 25% by mass or less.

Furthermore, the temperature of the alkali solution is preferably room temperature or higher, more preferably 30° C. or higher, preferably 80° C. or lower, and more preferably 75° C. or lower.

An etching amount is preferably 0.1 $g/m^2$ or more, more preferably 1 $g/m^2$ or more, preferably 20 $g/m^2$ or less, and more preferably 10 $g/m^2$ or less.

In addition, the process time is preferably two seconds to five minutes in accordance with the etching amount and more preferably two to ten seconds from the viewpoint of improving productivity.

In the case of carrying out the alkali etching process after the mechanical roughening process, a chemical etching process using a low-temperature acidic solution (hereinafter, also referred to as the "desmut process") is preferably carried out in order to remove a product generated by the alkali etching process.

An acid that is used in the acidic solution is not particularly limited, and, for example, sulfuric acid, nitric acid, and hydrochloric acid are exemplified. The concentration of the acidic solution is preferably 1% by mass to 50% by mass. In addition, the temperature of the acidic solution is preferably 20° C. to 80° C. In a case in which the concentration and temperature of the acidic solution are in the above-described ranges, the pot-like contamination resistance of lithographic printing plates for which the aluminum support is used further improves.

The roughening process is a process that carries out the electrochemical roughening process after the mechanical roughening process and the chemical etching process are carried out as desired; however, even in the case of carrying out the electrochemical roughening process without carrying out the mechanical roughening process, it is possible to carry out the chemical etching process using the alkali aqueous solution such as sodium hydroxide before the electrochemical roughening process. In such a case, it is possible to remove an impurity or the like present near the surface of the aluminum plate.

The electrochemical roughening process easily imparts fine unevenness (pits) to the surface of the aluminum plate and is thus suitable for producing lithographic printing plates having an excellent printing property.

The electrochemical roughening process is carried out using a direct current or an alternating current in an aqueous solution containing nitric acid or hydrochloric acid as a main component.

In addition, after the electrochemical roughening process, a chemical etching process below is preferably carried out. On the surface of the aluminum plate that has been subjected to the electrochemical roughening process, smut or an intermetallic compound is present. In order to efficiently remove particularly the smut in the chemical etching process that is carried out after the electrochemical roughening process, first, the chemical etching process using the alkali solution (alkali etching process) is preferably carried out. Regarding a variety of conditions for the chemical etching process using the alkali solution, the process temperature is preferably 20° C. to 80° C., and the process time is preferably 1 to 60 seconds. In addition, the alkali solution preferably contains an aluminum ion.

Furthermore, after the chemical etching process using the alkali solution is carried out after the electrochemical roughening process, in order to remove a product that is generated by the chemical etching process, a chemical etching process using a low-temperature acidic solution (desmut process) is preferably carried out.

In addition, even in the case of not carrying out the alkali etching process after the electrochemical roughening process, in order to efficiently remove the smut, the desmut process is preferably carried out.

Any of the above-described chemical etching processes can be carried out using a dipping method, a shower method, an application method, or the like, and there is no particular limitation.

<Anodization Process Step>

The anodization process step is a step of forming an oxide film of aluminum having micropores extending in a depth direction (thickness direction) on the surface of the aluminum plate by carrying out an anodization process on the aluminum plate that has been subjected to the roughening process. This anodization process forms an anode oxide film of aluminum having micropores on the surface of the aluminum plate.

The anodization process can be carried out using a method that has been carried out in this field in the related art, and a manufacturing condition is appropriately set so that the micropores can be formed in the end. Specifically, the average diameter (average opening diameter) of the micropores that are formed in the anodization process step is generally approximately 4 to 100 nm and preferably 5 to 60 nm. In the above-described range, it is easy to form micropores having a predetermined shape, and the performance of a lithographic printing plate precursor to be obtained and a lithographic printing plate to be obtained is also more favorable.

In addition, the depth of the micropore is generally approximately 10 nm or more and less than 3,000 nm and preferably 10 to 2,000 nm. In the above-described range, it is easy to form micropores having a predetermined shape, and the performance of a lithographic printing plate precursor to be obtained and a lithographic printing plate to be obtained is also more favorable.

The pore density of the micropores is not particularly limited, but the pore density is preferably 50 to 4,000 pores/$\mu m^2$ and more preferably 100 to 3,000 pores/$\mu m^2$. In the above-described range, the printing resistance and the neglectability of a lithographic printing plate to be obtained and the on-machine developability of the lithographic printing plate precursor are excellent.

In the anodization process step, it is possible to use an aqueous solution of sulfuric acid, phosphoric acid, oxalic acid, or the like mainly as an electrolytic bath. Depending on circumstances, it is also possible to use an aqueous solution or a non-aqueous solution of chromic acid, sulfamic acid, benzenesulfonic acid, or the like or a combination of two or more acids described above. In a case in which a direct current or an alternating current is caused to flow in the aluminum plate in the electrolytic bath, it is possible to form an anode oxide film on the surface of the aluminum plate. An aluminum ion may be included in the electrolytic bath.

The content of the aluminum ion is not particularly limited, but is preferably 1 to 10 g/L.

The condition for the anodization process is appropriately set depending on an electrolytic solution to be used, and, generally, the concentration of the electrolytic solution is appropriately in a range of 1% to 80% by mass (preferably 5% to 20% by mass), the liquid temperature is appropriately in a range of 5° C. to 70° C. (preferably 10° C. to 60° C.), the current density is appropriately in a range of 0.5 to 60 A/$dm^2$ (preferably 5 to 50 A/$dm^2$), the voltage is appropriately in a range of 1 to 100 V (preferably 5 to 50 V), and the electrolysis time is appropriately in a range of 1 to 100 seconds (preferably 5 to 60 seconds).

Among these anodization processes, particularly, a method in which anodization is carried out at a high current density in sulfuric acid, which is described in the specification of GB1,412,768A, is preferred.

The anodization process can also be carried out a plurality of times. One or more conditions such as the kind, concentration, liquid temperature, current density, voltage, electrolysis time, and the like of the electrolytic solution being used in the respective anodization processes can be changed. In a case in which the number of times of the anodization process is two, there is also a case in which the first anodization process is referred to as the first anodization process and a second anodization process is referred to as the second anodization process. In the case of carrying out the first anodization process and the second anodization process, it is possible to produce anode oxide films having different shapes, and it becomes possible to provide a lithographic printing plate precursor being excellent in terms of printing performance.

Furthermore, it is also possible to carry out a pore widening process subsequent to the anodization process and then, again, carry out the anodization process. In this case, the first anodization process, the pore widening process, and the second anodization process are carried out.

The shape of the micropore that is formed by the anodization process is a substantially straight pipe shape (substantially cylindrical shape) in which the diameter of an ordinary micropore almost does not change in the depth direction (thickness direction), but may be a conic shape in which the diameter continuously decreases in the depth direction (thickness direction). In addition, the shape of the micropore may be a shape in which the diameter discontinuously decreases in the depth direction (thickness direction).

As the micropore having a shape in which the diameter discontinuously decreases in the depth direction (thickness direction), specifically, a micropore constituted of large-diameter pore portions extending in the depth direction from the surface of the anode oxide film and small-diameter pore portions that communicate with a bottom portion of the large-diameter pore portion and extends in the depth direction from a communication location is exemplified. In order to form a micropore having the above-described shape, it is possible to use the method in which the first anodization process, the pore widening process, and the second anodization process are carried out.

In the micropores having the large-diameter pore portion and the small-diameter pore portion, the average diameter of the large-diameter pore portions on the surface of the anode oxide film is 10 to 100 nm and preferably 15 to 60 nm.

The large-diameter pore portion is a pore portion extending 10 to 1,000 nm in the depth direction (thickness direction) from the surface of the anode oxide film. The depth is preferably 10 to 200 nm.

The bottom portion of the large-diameter pore portion is located 10 to 1,000 nm in the depth direction (thickness direction) from the surface of the anode oxide film.

The shape of the large-diameter pore portion is not particularly limited, for example, a substantially straight pipe shape (substantially cylindrical shape) and a conic shape in which the diameter continuously decreases in the depth direction (thickness direction) are exemplified, and a substantially straight pipe shape is preferred.

The small-diameter pore portion is a pore portion that communicates with the bottom portion of the large-diameter pore portion and extends 20 to 2,000 nm in the depth direction (thickness direction) from the communication location. The depth is preferably 300 to 1,500 nm.

The average diameter of the small-diameter pore portions at the communication location is preferably 13 nm or less and more preferably 11 nm or less. The lower limit is not particularly limited, but is generally 8 nm or more.

The shape of the small-diameter pore portion is not particularly limited, for example, a substantially straight pipe shape (substantially cylindrical shape) and a conic shape in which the diameter continuously decreases in the depth direction (thickness direction) are exemplified, and a substantially straight pipe shape is preferred.

As the micropores having the large-diameter pore portion and the small-diameter pore portion, micropores constituted of the large-diameter pore portions extending up to a location of 10 to 1,000 nm deep from the surface of the anode oxide film and the small-diameter pore portions that communicate with the bottom portion of the large-diameter pore portion and extends up to a location of 20 to 2,000 nm deep from a communication location, in which the average diameter of the small-diameter pore portions is 5% to 80% of the average diameter of the large-diameter pore portions are preferred from the viewpoint of adjusting the area ratio of a crack present on the surface of the anode oxide film in a region corresponding to the shear droop width Y according to the present invention to 30% or less and/or adjusting the average width of the cracks to 20 µm or less.

<Pore Widening Process Step>

The pore widening process step is a process of enlarging the diameters of the micropores (pore diameters) present in the anode oxide film formed by the anodization process step (pore diameter-enlarging process). This pore widening process enlarges the diameters of the micropores and forms an anode oxide film having micropores having a larger average diameter.

The pore widening process is carried out by bringing the aluminum plate obtained by the anodization process step into contact with an acid aqueous solution or an alkali aqueous solution. A method for bringing the aluminum plate into contact with the aqueous solution is not particularly limited, and, for example, a dipping method and a spraying method are exemplified. Between them, the dipping method is preferred.

In the case of using an alkali aqueous solution in the pore widening process step, it is preferable to use an alkali aqueous solution of at least one selected from the group consisting of sodium hydroxide, potassium hydroxide, and lithium hydroxide. The concentration of the alkali aqueous solution is preferably 0.1% to 5% by mass. It is appropriate to adjust the pH of the alkali aqueous solution to 11 to 13 and then bring the aluminum plate into contact with the alkali aqueous solution for 1 to 300 seconds (preferably 1 to 50 seconds) under a condition of 10° C. to 70° C. (preferably 20° C. to 50° C.). At this time, an alkali process liquid may include a metallic salt of a polyhydric weak acid such as carbonate, borate, or phosphate.

In the case of using an acid aqueous solution in the pore widening process step, it is preferable to use an aqueous solution of an inorganic acid such as sulfuric acid, phosphoric acid, nitric acid, or hydrochloric acid or a mixture thereof. The concentration of the acid aqueous solution is preferably 1% to 80% by mass and more preferably 5% to 50% by mass. It is appropriate to bring the aluminum plate into contact with the acid aqueous solution for 1 to 300 seconds (preferably 1 to 150 seconds) under a condition of the liquid temperature of the acid aqueous solution being 5° C. to 70° C. (preferably 10° C. to 60° C.). At this time, the alkali aqueous solution or the acid aqueous solution may include an aluminum ion. The content of the aluminum ion is not particularly limited, but is preferably 1 to 10 g/L.

<End Portion Pore Widening Process Step>

The pore widening process step is also preferably carried out only on a partial region (end portion) on the support. In the case of carrying out the pore widening process not on the entire surface of the support but on a partial region as described above, it is possible to prevent the degradation of scratch resistance.

As a method for carrying out the pore widening process only in a partial region, it is possible to use a well-known method such as a die coating method, a dip coating method, an air knife coating method, a curtain coating method, a roller coating method, a wire bar coating method, a gravure coating method, a slide coating method, an ink jet coating method, a dispenser coating method, or a spraying method, but an ink jet method or a dispenser coating method is preferred since it is necessary to apply the acid aqueous solution or the alkali aqueous solution to a part of the support. In addition, a region to which the aqueous solution is applied preferably reaches two facing sides of the cut lithographic printing plate precursor.

The acid aqueous solution or the alkali aqueous solution may be applied from an end portion of the support or may be applied to a location other than the end portion of the support and these application locations may be combined together. In addition, in any case of the case of applying the aqueous solution from the end portion of the support and the case of applying the aqueous solution to a location other than the end portion of the support, the aqueous solution is preferably applied in a band shape having a constant width. A preferred application width is 1 to 50 mm. In the case of cutting an application region having the application width, the application region is preferably present 1 cm or less from the end portion after the cutting. Regarding the cutting, cutting may be carried out at one plate on the application region or cutting may be carried out at two places on the same application region.

<Hydrophilization Process Step>

The method for manufacturing the aluminum support may have a hydrophilization process step of carrying out a hydrophilization process after the pore widening process step. As the hydrophilization process, it is possible to use a well-known method disclosed in Paragraphs 0109 to 0114 of JP2005-254628A.

The hydrophilization process is preferably carried out using a method in which the aluminum plate is immersed in an aqueous solution of an alkali metal silicate such as sodium silicate or potassium silicate, a method in which a hydrophilic undercoat layer is formed by applying a hydrophilic vinyl polymer or a hydrophilic compound, or the like.

The hydrophilization process using an aqueous solution of an alkali metal silicate such as sodium silicate or potassium silicate can be carried out according to a method and an order described in the specification of U.S. Pat. No. 2,714,066B and the specification of U.S. Pat. No. 3,181,461B.

The aluminum support may have, as necessary, a backcoat layer including an organic polymer compound described in JP1993-045885A (JP-H5-045885A) or an alkoxy compound of silicon described in JP1994-035174A (JP-H6-035174A) on a surface opposite to the image-recording layer.

[Image-Recording Layer]

The image-recording layer constituting the on-machine development-type lithographic printing plate precursor will be described.

The image-recording layer contains a compound having a support adsorptive property and having a molecular weight of 1,000 or less. The compound does not have an unsaturated double bond group in the molecule. The content of the compound is substantially the same in the plane of the image-recording layer.

The compound having a support adsorptive property, having a molecular weight of 1,000 or less, and not having an unsaturated double bond group in the molecule, which is contained in the image-recording layer, (hereinafter, also referred to as the specific low-molecular-weight compound) will be described.

The specific low-molecular-weight compound is efficiently adsorbed to a crack during on-machine development, has a characteristic of hydrophilizing the crack, and contributes to the prevention of edge contamination.

One of the characteristics of the specific low-molecular-weight compound is to have a support adsorptive property. Here, the "support adsorptive property" refers to an adsorptive property to the anode oxide film that the aluminum support has. The presence or absence of the adsorptive property to the anode oxide film can be easily determined using the following method.

That is, a solution is prepared by dissolving a testing compound in a readily-soluble solvent (for example, water). This solution is applied onto and dried on the aluminum support having the anode oxide film so that the coating amount after drying reaches 30 mg/m². Next, the aluminum support onto which the testing compound has been applied is washed and dried repeatedly five times using the readily-soluble solvent, and then the amount of the testing compound that has not been washed and removed but remains is measured. The amount of the testing compound remaining may be obtained by directly determining the amount of the testing compound remaining or by determining the amount of the testing compound dissolved in a washing liquid. The amount of the testing compound can be determined by carrying out, for example, fluorescent X-ray measurement, reflectance absorbance measurement, or the like.

In a case in which the amount of the testing compound remaining is 1 mg/m² or more, the testing compound is determined to have a support adsorptive property.

The specific low-molecular-weight compound preferably has a group exhibiting an adsorptive property to the anode oxide film that the aluminum support has in order to have a support adsorptive property. As the group exhibiting an adsorptive property to the anode oxide film that the aluminum support, functional groups capable of forming a chemical bond (for example, an ionic bond, a hydrogen bond, or a coordinate bond) with a substance present on the surface of the anode oxide film (for example, metal or a metal oxide) or a functional group (for example, a hydroxyl group) are exemplified. Among such functional groups, an acid group is preferred. The acid group preferably has an acid dissociation constant (pKa) of 7 or less. As examples of the acid group, a phenolic hydroxyl group, a carboxyl group, $-SO_3H$, $-OSO_3H$, $-PO_3H_2$, $-OPO_3H_2$, $-CONHSO_2-$, $-SO_2NHSO_2-$, $-COCH_2COCH_3$, and the like are exemplified. Particularly, $-OPO_3H_2$ and $PO_3H_2$ are preferred. The acid group may form a salt. As a salt that the acid group forms, an alkali metal salt, an alkaline-earth metal salt, an ammonium salt, and the like are exemplified.

The molecular weight of the specific low-molecular-weight compound is 1,000 or less. In a case in which the molecular weight is 1,000 or less, the specific low-molecular-weight compound easily migrates on the surface of the anode oxide film during on-machine development, and an excellent effect for preventing edge contamination can be obtained. The molecular weight is preferably 50 to 1,000, more preferably 50 to 800, and still more preferably 50 to 600.

The specific low-molecular-weight compound does not have an unsaturated double bond group in the molecule. The unsaturated double bond group is a polymerizable group, and the scope thereof include ethylenic unsaturated groups such as a (meth)acrylic group, a vinyl group, an allyl group, and a styryl group. In a case in which the specific low-molecular-weight compound does not have an unsaturated double bond group in the molecule, it is possible to suppress the specific low-molecular-weight compound being cured by exposure together with the image-recording layer.

As the specific low-molecular-weight compound, it is possible to use an oxo acid. The oxo acid refers to a compound in which a hydroxyl group (—OH) and an oxo group (=O) bond to the same atom and the hydroxyl group imparts an acidic proton.

As the specific low-molecular-weight compound, phosphoric acid, polyphosphoric acid, metaphosphoric acid, ammonium phosphate monobasic, ammonium phosphate dibasic, sodium dihydrogen phosphate, sodium monohydrogen phosphate, potassium phosphate monobasic, potassium phosphate dibasic, sodium tripolyphosphate, potassium pyrophosphate, sodium hexametaphosphate, phosphinic acid, ethylphosphonic acid, propylphosphonic acid, i-propylphosphonic acid, butylphosphonic acid, hexylphosphonic acid, octylphosphonic acid, dodecylphosphonic acid, octadecylphosphonic acid, 2-hydroxyethylphosphonic acid, sodium salts or potassium salts thereof, alkylphosphonic acid monoalkyl esters such as methyl methylphosphonate, methyl ethylphosphonate, and methyl 2-hydroxyethylphosphonate, sodium salts or potassium salts thereof, alkylenediphosphic acids such as methylenediphosphonic acid and ethylenediphosphonic acid, sodium salts or potassium salts thereof, polyvinylphosphonic acid, p-toluenesulfonic acid, sodium p-toluenesulfonic acid, sulfophthalic acid, citric acid, and the like are exemplified.

The specific low-molecular-weight compound is preferably a compound represented by Formula 1.

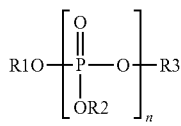

Formula 1

In Formula 1, n represents an integer of 2 to 10, and R1, R2, and R3 each independently represent a hydrogen atom, an alkyl group, or an alkylene oxide group.

The alkyl group in Formula 1 is preferably an alkyl group having 1 to 10 carbon atoms, more preferably an alkyl group having 1 to 5 carbon atoms, and still more preferably an alkyl group having 1 to 3 carbon atoms.

The alkylene oxide group in Formula 1 is preferably an alkylene oxide group having 1 to 10 alkylene oxide units having 2 or 3 carbon atoms, more preferably an alkylene oxide group having 1 to 5 alkylene oxide units having 2 or 3 carbon atoms, and still more preferably an alkylene oxide group having 1 to 3 alkylene oxide units having 2 or 3 carbon atoms.

As the specific low-molecular-weight compound, a phosphoric acid, a polyphosphoric acid, a phosphonic acid, or a phosphinic acid are particularly preferred.

The specific low-molecular-weight compound may be used singly or two or more specific low-molecular-weight compounds may be jointly used.

The content of the specific low-molecular-weight compound is preferably 10 to 150 mg/m$^2$, more preferably 30 to 100 mg/m$^2$, and still more preferably 50 to 100 mg/m$^2$.

In the present invention, the content of the specific low-molecular-weight compound is substantially the same in the plane of the image-recording layer. Here, the expression "the content of the specific low-molecular-weight compound is substantially the same in the plane of the image-recording layer" means that the specific low-molecular-weight compound is almost uniformly present in the plane of the image-recording layer and there is no substantial difference in the content of the specific low-molecular-weight compound between the central portion and the end portion of the lithographic printing plate precursor. That is, the expression means that there is no difference in the content except for a difference in the content of the specific low-molecular-weight compound in the plane of the image-recording layer which can be ordinarily caused during the application onto the image-recording layer.

Therefore, the present invention is different from the formation of a state in which the content of the specific low-molecular-weight compound in a region other than the end portion is set to be larger than the content of the specific low-molecular-weight compound in the end portion by intentionally applying the specific low-molecular-weight compound only to the end portion of the lithographic printing plate precursor.

<Polymer Particle>

The image-recording layer preferably contains a polymer particle. The polymer particle contributes to the improvement of on-machine developability. The polymer particle is preferably a polymer particle capable of converting the image-recording layer to be hydrophobic when heat is applied to the image-recording layer. The polymer particle is preferably at least one particle selected from a hydrophobic thermoplastic polymer particle, a thermally reactive polymer particle, a polymer particle having a polymerizable group, a microcapsule encapsulating a hydrophobic compound, and a micro gel (crosslinked polymer particle).

As the hydrophobic thermoplastic polymer particle, hydrophobic thermoplastic polymer particles described in Research Disclosure No. 33303 of January 1992 and the specifications of JP1997-123387A (JP-H09-123387A), JP1997-131850A (JP-H09-131850A), JP1997-171249A (JP-H09-171249A), JP1997-171250A (JP-H09-171250A), EP931647B, and the like are preferably exemplified.

Specific examples of a polymer constituting the hydrophobic thermoplastic polymer particle include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures thereof. Preferred examples thereof include copolymers having polystyrene, styrene, and acrylonitrile and polymethyl methacrylate. The average particle diameter of the hydrophobic thermoplastic polymer particle is preferably 0.01 to 2.0 μm.

As the thermally reactive polymer particle, a polymer particle having a thermally reactive group is exemplified. The polymer particle having a thermally reactive group forms a hydrophobic region by crosslinking by a thermal reaction or a change in a functional group during the crosslinking.

The thermally reactive group in the polymer particle having a thermally reactive group may be a functional group that causes any reaction as long as a chemical bond is formed, but is preferably a polymerizable group. Examples thereof include an ethylenic unsaturated group that causes a radical polymerization reaction (for example, an acryloyl group, a methacryloyl group, a vinyl group, an allyl group, or the like), a cationic polymerizable group (for example, a vinyl group, a vinyloxy group, an epoxy group, an oxetanyl group, or the like), an isocyanato group that causes an addition reaction or a blocked body thereof, an epoxy group, a vinyloxy group, a functional group having an active hydrogen atom that is a reaction partner thereof (for example, an amino group, a hydroxy group, a carboxy group, or the like), a carboxy group that causes a condensation reaction, a hydroxy group or an amino group that is a reaction partner, an acid anhydride that causes a ring-opening addition reaction, an amino group or a hydroxy group which is a reaction partner, and the like.

Examples of the microcapsule include microcapsules encapsulating all or part of the constituent components of the image-recording layer as described in JP2001-277740A and JP2001-277742A. The constituent components of the image-recording layer can also be contained outside the microcapsule. As the image-recording layer containing the microcapsule, an image-recording layer encapsulating the hydrophobic constituent component in the microcapsule and containing the hydrophilic constituent component outside the microcapsule is a preferred aspect.

The micro gel (crosslinked polymer particle) is capable of containing part of the constituent components of the image-recording layer at least one of on the inside or surface. Particularly, an aspect of a reactive micro gel having a radical polymerizable group on the surface is preferred from the viewpoint of image-forming sensitivity or printing resistance.

In order to encapsulate the constituent components of the image-recording layer in a microcapsule or a micro gel, a well-known method can be used.

The average particle diameter of the microcapsule or the micro gel is preferably 0.01 to 3.0 µm, more preferably 0.05 to 2.0 µm, and particularly preferably 0.10 to 1.0 µm. In this range, a favorable resolution and favorable temporal stability can be obtained.

As the polymer particle, from the viewpoint of the contribution to on-machine developability, a particle of a polymer including a monomer unit derived from a styrene compound and/or a monomer unit derived from a (meth)acrylonitrile compound is preferred. In addition, a particle of a polymer further including a monomer unit derived from a poly(ethylene glycol)alkyl ether methacrylate compound is preferred.

The polymer particle may be used singly or two or more polymer particles may be jointly used.

The content of the polymer particle is preferably 5% to 90% by mass, more preferably 5% to 80% by mass, and still more preferably 10% to 75% by mass of the total solid content of the image-recording layer.

The image-recording layer preferably contains a polymerization initiator, an infrared absorber, and a polymerizable compound.

<Polymerization Initiator>

The polymerization initiator is a compound that generates a polymerization-initiating species such as a radical or a cation using the energy of either or both light and heat, and it is possible to appropriately select and use a well-known thermopolymerization initiator, a compound having a bond with a small bond dissociation energy, a photopolymerization initiator, or the like.

The polymerization initiator is preferably an infrared-sensitive polymerization initiator. In addition, the polymerization initiator is preferably a radical polymerization initiator. Two or more radical polymerization initiators may be jointly used.

The radical polymerization initiator may be any of an electron-receiving polymerization initiator and an electron-donating polymerization initiator.

(Electron-Receiving Polymerization Initiator)

As the electron-receiving polymerization initiator, for example, an organic halide, a carbonyl compound, an azo compound, an organic peroxide, a metallocene compound, an azido compound, a hexaarylbiimidazole compound, a disulfone compound, an oxime ester compound, and an onium salt compound are exemplified.

As the organic halide, for example, a compound described in Paragraphs 0022 and 0023 of JP2008-195018A is preferred.

As the carbonyl compound, for example, a compound described in Paragraph 0024 of JP2008-195018A is preferred.

As the azo compound, for example, an azo compound described in JP1996-108621A (JP-H08-108621A) or the like is preferred.

As the organic peroxide, for example, a compound described in Paragraph 0025 of JP2008-195018A is preferred.

As the metallocene compound, for example, a compound described in Paragraph 0026 of JP2008-195018A is preferred.

As the azido compound, for example, a compound such as 2,6-bis(4-azidobenzylidene)-4-methylcyclohexanone is preferred.

As the hexaarylbiimidazole compound, for example, a compound described in Paragraph 0027 of JP2008-195018A is preferred.

As the disulfone compound, for example, a compound described in each of JP1986-166544A (JP-S61-166544A) and JP2002-328465A is preferred.

As the oxime ester compound, for example, a compound described in Paragraphs 0028 to 0030 of JP2008-195018A is preferred.

Among these electron-receiving polymerization initiators, as a more preferred electron-receiving polymerization initiator, onium salts such as an iodonium salt, a sulfonium salt, and an azinium salt are exemplified. An iodonium salt and a sulfonium salt are particularly preferred. Specific examples of the iodonium salt and the sulfonium salt will be described below, but the present invention is not limited thereto.

As examples of the iodonium salt, a diphenyl iodonium salt is preferred, a diphenyl iodonium salt having, particularly, an electron-donating group, for example, an alkyl group or an alkoxyl group as a substituent is preferred, and an asymmetric diphenyl iodonium salt is preferred. Specific examples thereof include diphenyliodonium=hexafluorophosphate, 4-methoxyphenyl-4-(2-methylpropyl) phenyliodonium=hexafluorophosphate, 4-(2-methylpropyl)phenyl-p-tolyliodonium=hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxyphenyliodonium=hexafluorophosphate, and bis(4-t-butylphenyl)iodonium=hexafluorophosphate.

As examples of the sulfonium salt, a triarylsulfonium salt is preferred, a triarylsulfonium salt having, particularly, an electron-attracting group as a substituent, for example, in which at least part of groups on an aromatic ring are substituted with a halogen atom is preferred, and a triarylsulfonium salt in which the total number of substituted halogen atoms on the aromatic ring is four or greater is more preferred. Specific examples thereof include triphenylsulfonium=hexafluorophosphate, triphenylsulfonium=benzoyl formate, bis(4-chlorophenyl)phenylsulfonium=benzoyl formate, bis(4-chlorophenyl)-4-methylphenyl sulfonium=tetrafluoroborate, tris(4-chlorophenyl)sulfonium=3,5-bis(methoxycarbonyl)benzenesulfonate, tris(4-chlorophenyl)sulfonium=hexafluorophosphate, and tris(2,4-dichlorophenyl)sulfonium=hexafluorophosphate.

The electron-receiving polymerization initiator may be used singly or two or more electron-receiving polymerization initiators may be jointly used.

The content of the electron-receiving polymerization initiator is preferably 0.1% to 50% by mass, more preferably 0.5% to 30% by mass, and still more preferably 0.8% to 20% by mass of the total solid content of the image-recording layer.

(Electron-Donating Polymerization Initiator)

The electron-donating polymerization initiator contributes to the improvement of the printing resistance of a lithographic printing plate that is produced from the lithographic printing plate precursor. As the electron-donating polymerization initiator, for example, the following five kinds are exemplified.

(i) Alkyl or aryl ate complex: It is considered that a carbon-hetero bond is oxidatively cleaved, and an active radical is generated. Specifically, a borate compound is exemplified.

(ii) Aminoacetic acid compound: It is considered that a C—X bond on carbon adjacent to nitrogen is cleaved by oxidation, and an active radical is generated. As X, a hydrogen atom, a carboxy group, a trimethylsilyl group, or a benzyl group is preferred. Specifically, N-phenylglycines (which may have a substituent in a phenyl group), N-phenyl iminodiacetic acid (which may have a substituent in a phenyl group), and the like are exemplified.

(iii) Sulfur-containing compound: A compound in which a nitrogen atom in the above-described aminoacetic acid compound is substituted into a sulfur atom is capable of generating an active radical by the same action. Specifically, phenylthioacetic acid (which may not have a substituent in a phenyl group) and the like are exemplified.

(iv) Tin-containing compound: A compound in which a nitrogen atom in the above-described aminoacetic acid compound is substituted into a tin atom is capable of generating an active radical by the same action.

(v) Sulfinates: Sulfinates are capable of generating an active radical by oxidation. Specifically, sodium arylsulfinate and the like are exemplified.

Among the electron-donating polymerization initiators, a borate compound is preferred. As the borate compound, a tetraaryl borate compound or a monoalkyltriaryl borate compound is preferred, and, from the viewpoint of the stability of the compound, a tetraaryl borate compound is more preferred.

As a counter cation that the borate compound has, an alkali metal ion or a tetraalkyl ammonium ion is preferred, and a sodium ion, a potassium ion, or a tetrabutylammonium ion is more preferred.

As specific examples of the borate compound, compounds illustrated below are exemplified. Here, $X_c^+$ represents a monovalent cation and is preferably an alkali metal ion or a tetraalkyl ammonium ion and more preferably an alkali metal ion or a tetrabutylammonium ion. In addition, Bu represents an n-butyl group.

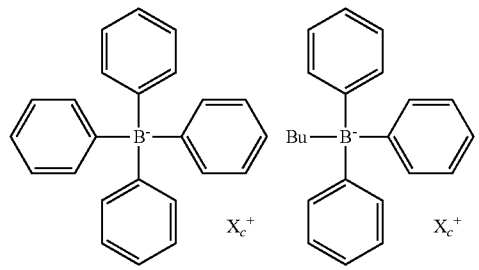

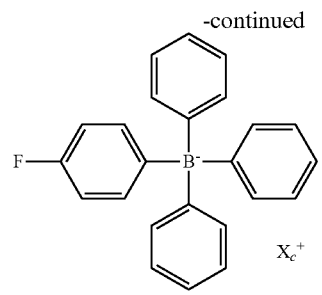

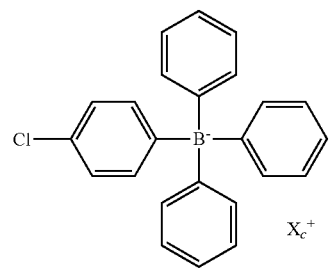

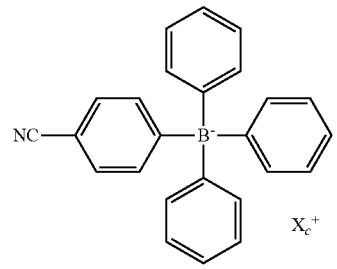

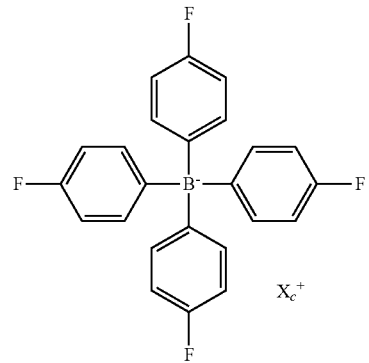

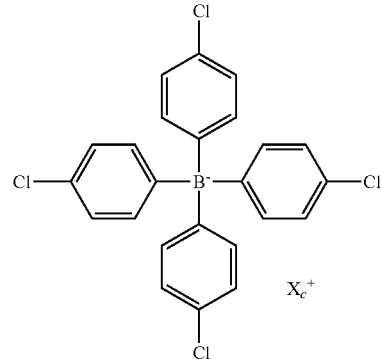

-continued
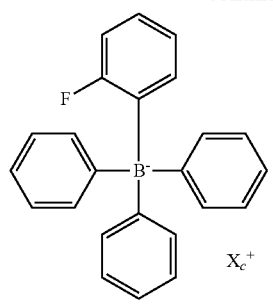
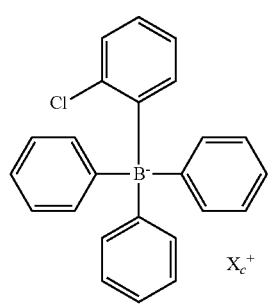
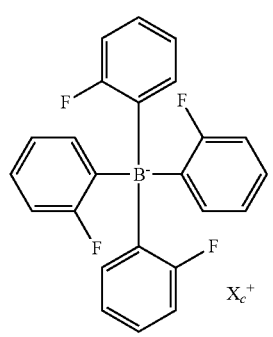
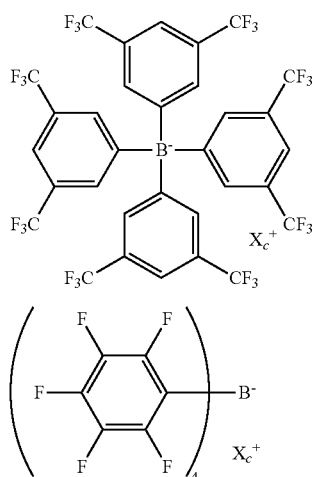
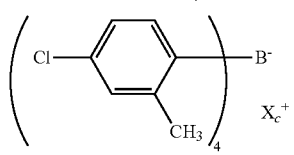
-continued
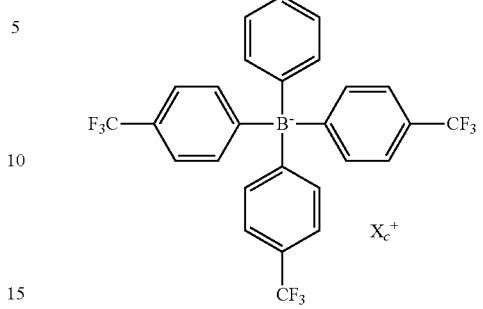
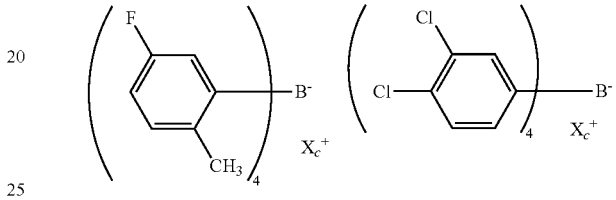
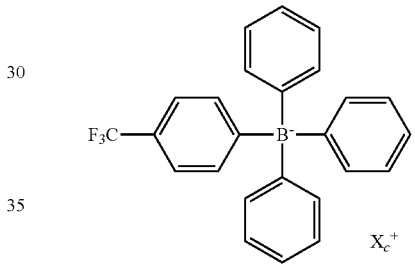
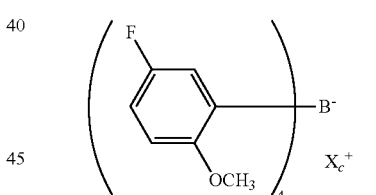
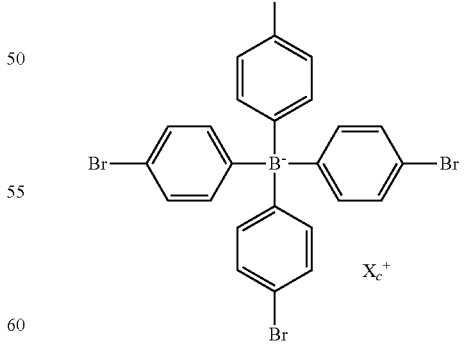
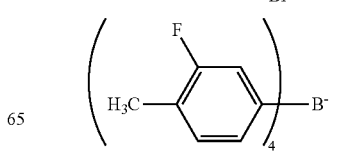

-continued

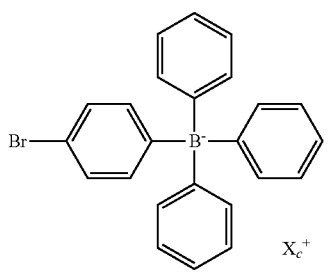

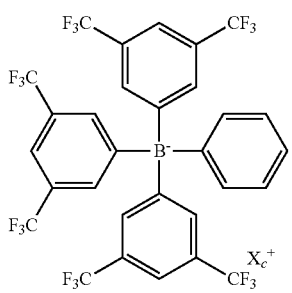

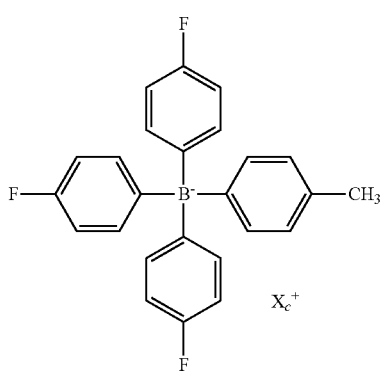

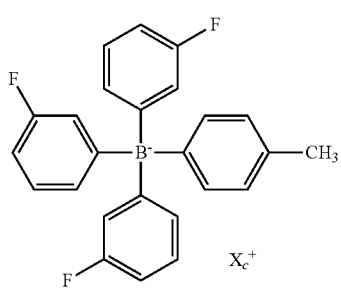

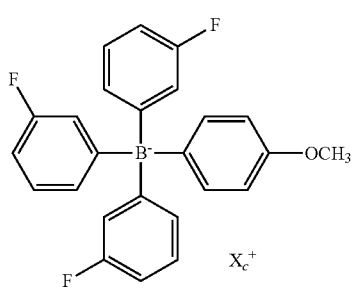

-continued

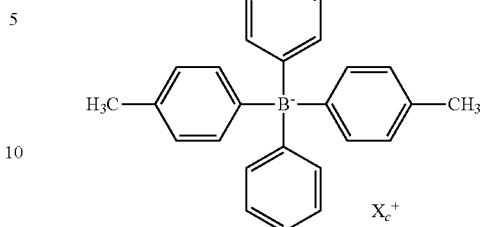

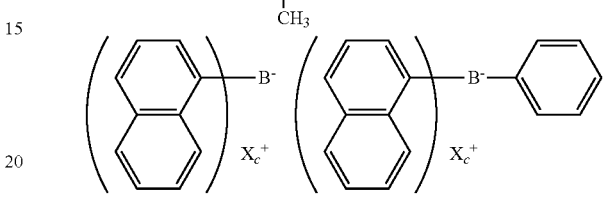

The electron-donating polymerization initiator may be used singly or two or more electron-donating polymerization initiators may be jointly used.

The content of the electron-donating polymerization initiator is preferably 0.01% to 30% by mass, more preferably 0.05% to 25% by mass, and still more preferably 0.1% to 20% by mass of the total solid content of the image-recording layer.

<Infrared Absorber>

The infrared absorber has a function of migrating an electron and/or energy to the polymerization initiator or the like by being excited by an infrared ray. In addition, the infrared absorber has a function of converting an absorbed infrared ray to heat. The infrared absorber preferably has maximum absorption in a wavelength range of 750 to 1,400 nm. As the infrared absorber, a pigment and a dye are exemplified, and a pigment is preferably used.

As the dye, it is possible to use a commercially available dye and a well-known dye described in publications of "Dye Handbooks" (edited by the Society of Synthetic Organic Chemistry, Japan and published on 1970) and the like. Specifically, dyes such as an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium colorant, a pyrylium salt, and a metal thiolate complex are exemplified.

Among these dyes, a cyanine colorant, a squarylium colorant, and a pyrylium salt are preferred, a cyanine colorant is more preferred, and an indolenine cyanine colorant is particularly preferred.

As the cyanine colorant, a cyanine colorant represented by Formula (a) is exemplified.

Formula (a)

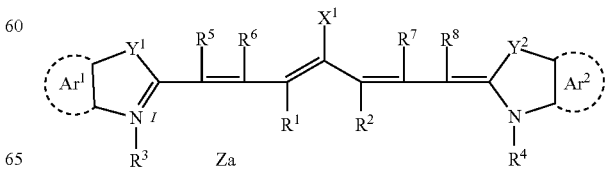

In Formula (a), $X^1$ represents a hydrogen atom, a halogen atom, $-N(R^9)(R^{10})$, $-X^2-L^1$, or a group illustrated below. Here, $R^9$ and $R^{10}$ may be identical to or different from each other and each may independently represent an aromatic hydrocarbon group having 6 to 10 carbon atoms, an alkyl group having 1 to 8 carbon atoms, or a hydrogen atom or $R^9$ and $R^{10}$ may bond to each other to form a ring. The aromatic hydrocarbon group having 6 to 10 carbon atoms or the alkyl group having 1 to 8 carbon atoms may have a substituent. $R^9$ and $R^{10}$ are both preferably a phenyl group. $X^2$ represents an oxygen atom or a sulfur atom, and $L^1$ represents a hydrocarbon group having 1 to 12 carbon atoms or a hydrocarbon group having 1 to 12 carbon atoms which includes a hetero atom. Here, the hetero atom represents N, S, O, a halogen atom, or Se. In a group illustrated below, $Xa^-$ is identical to $Za^-$ described below, and Ra represents a hydrogen atom or a substituent selected from an alkyl group, an aryl group, a substituted or unsubstituted amino group, and a halogen atom.

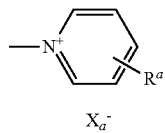

In Formula (a), $R^1$ and $R^2$ each independently represent a hydrocarbon group having 1 to 12 carbon atoms. From the viewpoint of the storage stability of the coating fluid for the image-recording layer, $R^1$ and $R^2$ are preferably a hydrocarbon group having 2 or more carbon atoms, and, furthermore, it is particularly preferred that $R^1$ and $R^2$ bond to each other to form a five-membered ring or a six-membered ring.

In Formula (a), $Ar^1$ and $Ar^2$ may be identical to or different from each other and respectively represent an aromatic hydrocarbon group. The aromatic hydrocarbon group may have a substituent. As a preferred aromatic hydrocarbon group, a benzene ring group and a naphthalene ring group are exemplified. In addition, as a preferred substituent, a hydrocarbon group having 12 or less carbon atoms, a halogen atom, and an alkoxy group having 12 or less carbon atoms are exemplified. $Y^1$ and $Y^2$ may be identical to or different from each other and respectively represent a sulfur atom or a dialkyl methylene group having 12 or less carbon atoms. $R^3$ and $R^4$ may be identical to or different from each other and respectively represent a hydrocarbon group having 20 or less carbon atoms. The hydrocarbon group having 20 or less carbon atoms may have a substituent. As a preferred substituent, an alkoxy group having 12 or less carbon atoms, a carboxy group, and a sulfo group are exemplified. $R^5$, $R^6$, $R^7$, and $R^8$ may be identical to or different from each other and respectively represent a hydrogen atom or a hydrocarbon group having 12 or less carbon atoms. From the viewpoint of easiness in the procurement of a raw material, a hydrogen atom is preferred. In addition, $Za^-$ represents a counter anion. Here, the cyanine colorant represented by Formula (a) has an anionic substituent in the structure, and, in a case in which the neutralization of charges is not necessary, $Za^-$ is not required. From the viewpoint of the storage stability of the coating fluid for the image-recording layer, $Za^-$ is preferably a halide ion, a perchloric acid ion, a tetrafluoroborate ion, a hexafluorophosphate ion, or a sulfonic acid ion and more preferably a perchloric acid ion, a hexafluorophosphate ion, or an arylsulfonic acid ion.

In the cyanine colorant represented by Formula (a), $X^1$ is more preferably a diphenyl amino group. In addition, it is still more preferred that $X^1$ is a diphenyl amino group and $Y^1$ and $Y^2$ are both a dimethylmethylene group.

As specific examples of the cyanine colorant, a compound described in Paragraphs 0017 to 0019 of JP2001-133969A, a compound described in Paragraphs 0016 to 0021 of JP2002-023360A and Paragraphs 0012 to 0037 of JP2002-040638A, preferably, a compound described in Paragraphs 0034 to 0041 of JP2002-278057A and Paragraphs 0080 to 0086 of JP2008-195018A, and, particularly preferably, a compound described in Paragraphs 0035 to 0043 of JP2007-090850A are exemplified.

In addition, it is also possible to preferably use compounds described in Paragraphs 0008 and 0009 of JP1993-005005A (JP-H05-005005A) and Paragraphs 0022 to 0025 of JP2001-222101A.

As the pigment, a compound described in Paragraphs 0072 to 0076 of JP2008-195018A is preferred.

The infrared absorber may be used singly or two or more infrared absorbers may be jointly used.

The content of the infrared absorber is preferably 0.05% to 30% by mass, more preferably 0.1% to 20% by mass, and still more preferably 0.2% to 10% by mass of the total solid content of the image-recording layer.

<Polymerizable Compound>

The polymerizable compound may be, for example, a radical polymerizable compound or a cationic polymerizable compound, but is preferably an addition polymerizable compound having at least one ethylenic unsaturated bond (ethylenic unsaturated compound). The ethylenic unsaturated compound is preferably a compound having at least one terminal ethylenic unsaturated bond and more preferably a compound having two or more terminal ethylenic unsaturated bonds. The polymerizable compound may have a chemical form, for example, a monomer, a prepolymer, that is, a dimer, a trimer, or an oligomer, or a mixture thereof.

Examples of the monomer include unsaturated carboxylic acids (for example, acrylic acid, methacrylic acid, itaconic acid, crotonic acid, isocrotonic acid, and maleic acid), esters thereof, and amides thereof. Esters of unsaturated carboxylic acids and polyhydric amine compounds and amides of unsaturated carboxylic acids and polyhydric alcohol compounds are preferably used. In addition, addition reaction products between unsaturated carboxylic acid esters or amides having nucleophilic substituents such as hydroxy groups, amino groups, or mercapto groups and monofunctional or polyfunctional isocyanates or epoxies, dehydration condensation reaction products with monofunctional or polyfunctional carboxylic acids, and the like are also preferably used. In addition, addition reaction products between unsaturated carboxylic acid esters or amides having electrophilic substituents such as isocyanate groups and epoxy groups and monofunctional or polyfunctional alcohols, amines, or thiols, furthermore, substitution reaction products between unsaturated carboxylic acid esters or amides having dissociable substituents such as halogen atoms and tosyloxy groups and monofunctional or polyfunctional alcohols, amines, or thiols are also preferred. In addition, as additional examples, compound groups obtained by substituting the unsaturated carboxylic acids with unsaturated phosphonic acids, styrene, vinyl ethers, or the like can also be used. These compounds are described in JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-294935A, JP2006-243493A, JP2002-275129A, JP2003-064130A, JP2003-280187A, JP1998-333321A (JP-H10-333321A), and the like.

As specific examples of monomers of esters of polyhydric alcohol compounds and unsaturated carboxylic acids, acrylic acid esters include ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, polyester acrylate oligomers, and the like are exemplified. As methacrylic acid esters, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl] dimethyl methane, bis[p-(methacryloxyethoxy)phenyl] dimethyl methane, and the like are exemplified. In addition, as specific examples of monomers of amides of polyhydric amine compounds and unsaturated carboxylic acids, methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, and the like are exemplified.

In addition, urethane-based addition polymerizable compounds produced using an addition reaction between an isocyanate and a hydroxy group are also preferred, and specific examples thereof include vinyl urethane compounds having two or more polymerizable vinyl groups in one molecule obtained by adding vinyl monomers having a hydroxy group represented by Formula (M) to a polyisocyanate compound having two or more isocyanate groups in one molecule which is described in, for example, JP1973-041708B (JP-S48-041708B).

CH$_2$=C(R$^{M4}$)COOCH$_2$CH(R$^{M5}$)OH    (M)

In Formula (M), each of R$^{M4}$ and R$^{M5}$ independently represents a hydrogen atom or a methyl group.

In addition, urethane acrylates described in JP1976-037193A (JP-S51-037193A), JP1990-32293B (JP-H02-32293B), JP1990-16765B (JP-H02-16765B), JP2003-344997A, and JP2006-065210A, urethane compounds having ethylene oxide-based skeletons described in JP1983-49860B (JP-S58-49860B), JP1981-17654B (JP-S56-17654B), JP1987-39417B (JP-S62-39417B), JP1987-39418B (JP-S62-39418B), JP2000-250211A, and JP2007-094138A, and urethane compounds having hydrophilic groups described in US7153632B, JP1996-505958A (JP-H08-505958A), JP2007-293221A, and JP2007-293223A are also preferred.

The details of the structures of the polymerizable compound and the method for using the polymerizable compound such as whether to use the polymerizable compound singly or jointly and the amount of the polymerizable compound added can be randomly set in consideration of the final applications and the like of the lithographic printing plate precursor.

The content of the polymerizable compound is 1% to 50% by mass, preferably 3% to 30% by mass, and more preferably 5% to 20% by mass of the total solid content of the image-recording layer.

The image-recording layer may contain a binder polymer, a chain transfer agent, a low-molecular-weight hydrophilic compound, a sensitization agent, and other components.

<Binder Polymer>

As the binder polymer, a polymer having a film property is preferred, and a (meth)acrylic resin, a polyvinyl acetal resin, a polyurethane resin, and the like are preferably exemplified.

A binder polymer that is used in the image-recording layer of the on-machine development-type lithographic printing plate precursor (hereinafter, also referred to as the binder polymer for on-machine development) will be described in detail.

The binder polymer for on-machine development is preferably a binder polymer having an alkylene oxide chain. The binder polymer having an alkylene oxide chain may have a poly(alkylene oxide) portion in the main chain or a side chain. In addition, the binder polymer may be a graft polymer having a poly(alkylene oxide) in a side chain or a block copolymer of a block constituted of a repeating unit containing poly(alkylene oxide) and a block constituted of a repeating unit not containing (alkylene oxide).

In a case in which the binder polymer has a poly(alkylene oxide) portion in the main chain, a polyurethane resin is preferred. Examples of a polymer in the main chain in a case in which the binder polymer has a poly(alkylene oxide) portion in a side chain include a (meth)acrylic resin, a polyvinyl acetal resin, a polyurethane resin, a polyurea resin, a polyimide resin, a polyamide resin, an epoxy resin, a polystyrene resin, a novolac-type phenolic resin, a polyester resin, synthetic rubber, and natural rubber, and a (meth)acrylic resin is particularly preferred.

The alkylene oxide is preferably an alkylene oxide having 2 to 6 carbon atoms and particularly preferably an ethylene oxide or a propylene oxide.

The repeating number of the alkylene oxide in the poly(alkylene oxide) portion is preferably 2 to 120, more preferably 2 to 70, and still more preferably 2 to 50.

In a case in which the repeating number of the alkylene oxide is 120 or smaller, there is no case in which printing resistance is degraded due to both friction and an ink-receiving property, which is preferable.

The poly(alkylene oxide) portion is preferably included in a structure represented by Formula (AO) as the side chain of the binder polymer and more preferably included in the structure represented by Formula (AO) as a side chain of the (meth)acrylic resin.

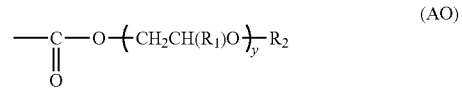

(AO)

In Formula (AO), y represents 2 to 120, $R_1$ represents a hydrogen atom or an alkyl group, and $R_2$ represents a hydrogen atom or a monovalent organic group.

The monovalent organic group is preferably an alkyl group having 1 to 6 carbon atoms. Specific examples thereof include a methyl group, an ethyl group, an n-propyl group, an isopropyl group, an n-butyl group, a sec-butyl group, an isobutyl group, a tert-butyl group, an n-pentyl group, an isopentyl group, a neopentyl group, an n-hexyl group, an isohexyl group, a 1,1-dimethyl butyl group, a 2,2-dimethyl butyl group, a cyclopentyl group, and cyclohexyl group.

In Formula (AO), y is preferably 2 to 70 and more preferably 2 to 50. $R_1$ is preferably a hydrogen atom or a methyl group and particularly preferably a hydrogen atom. $R_2$ is particularly preferably a hydrogen atom or a methyl group.

In order to improve the membrane hardness of image areas, the binder polymer may have a crosslinking property. In order to impart a crosslinking property to the polymer, it is necessary to introduce a crosslinking functional group such as an ethylenic unsaturated bond to the main chain or a side chain of the polymer. The crosslinking functional group may be introduced by means of copolymerization or may be introduced by a polymer reaction.

Examples of the polymer having an ethylenic unsaturated bond in the main chain of the molecules include poly-1,4-butadiene, poly-1,4-isoprene, and the like.

Examples of the polymer having an ethylenic unsaturated bond in a side chain of the molecules include polymers of an ester or amide of acrylic acid or methacrylic acid in which a residue (R of —COOR or —CONHR) of the ester or the amide has an ethylenic unsaturated bond.

Examples of the residue (the above-described R) having an ethylenic unsaturated bond include —(CH$_2$)$_n$CR$^{14}$=CR$^{24}$R$^{34}$, —(CH$_2$O)$_n$CH$_2$CR$^{14}$=CR$^{24}$R$^{34}$, —(CH$_2$CH$_2$O)$_n$CH$_2$CR$^{14}$=CR$^{24}$R$^{34}$, —(CH$_2$)$_n$NH—CO—O—CH$_2$CR$^{14}$=CR$^{24}$R$^{34}$, —(CH$_2$)$_n$—O—CO—CR$^{14}$=CR$^{24}$R$^{34}$, and —(CH$_2$CH$_2$O)$_2$—X$^A$ (in the formulae, R$^{A1}$ to R$^{A3}$ each independently represents a hydrogen atom, a halogen atom, an alkyl group having 1 to 20 carbon atoms, an aryl group, an alkoxy group, or an aryloxy group, and R$^{A1}$ and R$^{A2}$ or R$^{A3}$ may bond to each other to form a ring. n represents an integer of 1 to 10. X$^A$ represents a dicyclopentadienyl residue.).

Specific examples of the ester residue include —CH$_2$CH=CH$_2$, —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$—NHCOO—CH$_2$CH=CH$_2$, and —CH$_2$CH$_2$O—X (in the formula, X represents a dicyclopentadienyl residue.).

Specific examples of the amide residue include —CH$_2$CH=CH$_2$, —CH$_2$CH$_2$—Y (in the formula, Y represents a cyclohexene residue.), and —CH$_2$CH$_2$—OCO—CH=CH$_2$.

The binder polymer having a crosslinking property is cured as described below. For example, a free radical (a polymerization-initiating radical or a radical growing in the polymerization process of a polymerizable compound) is added to the crosslinking functional group and is addition-polymerized between the polymers directly or through a polymerization chain of the polymerizable compound, thereby forming a crosslinking between polymer molecules. Alternatively, an atom in the polymer (for example, a hydrogen atom on a carbon atom adjacent to the functional crosslinking group) is removed by a free radical, polymer radicals are generated, and the polymer radicals bond to each other, thereby forming and curing a crosslinking between polymer molecules.

The content of the crosslinking group in the binder polymer (the content of an unsaturated double bond that can be radical-polymerized by means of iodimetry) is preferably 0.1 to 10.0 mmol, more preferably 1.0 to 7.0 mmol, and still more preferably 2.0 to 5.5 mmol per gram of the binder polymer from the viewpoint of a favorable sensitivity and favorable storage stability.

Hereinafter, specific examples 1 to 11 of the binder polymer will be illustrated, but the present invention is not limited thereto. In the following exemplary compounds, numeric values shown together with individual repeating units (numeric values shown together with main chain repeating units) represent the molar percentages of the repeating units. The numeric value shown together with the repeating unit of a side chain represents the repeating number of the repeating portions. In addition, Me represents a methyl group, Et represents an ethyl group, and Ph represents a phenyl group.

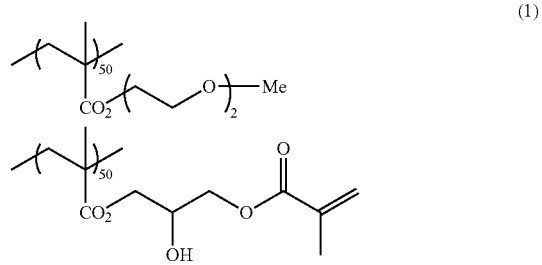

(1)

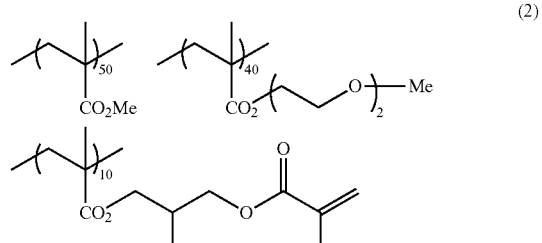

(2)

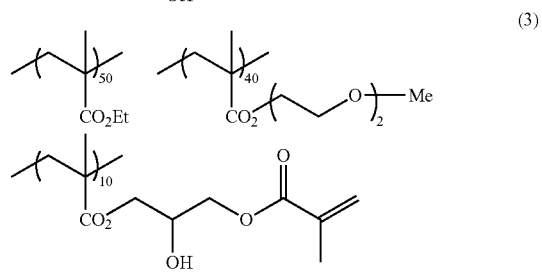

(3)

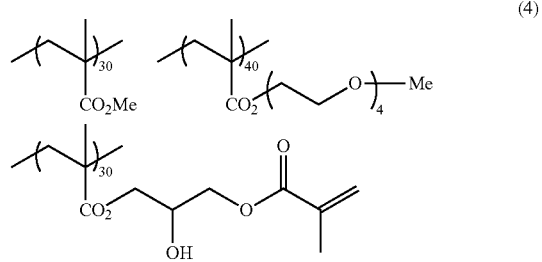

(4)

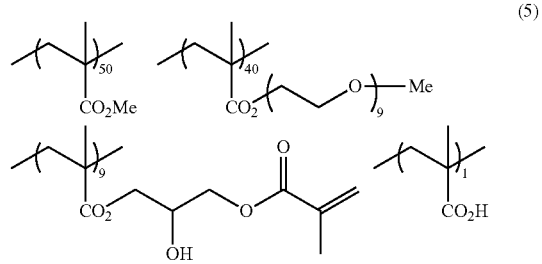

(5)

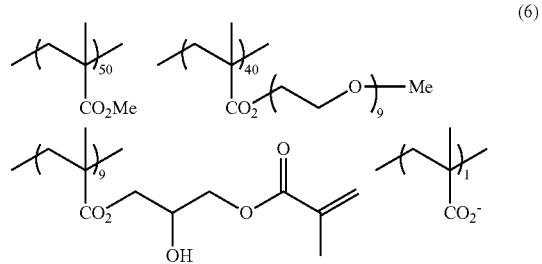

(6)

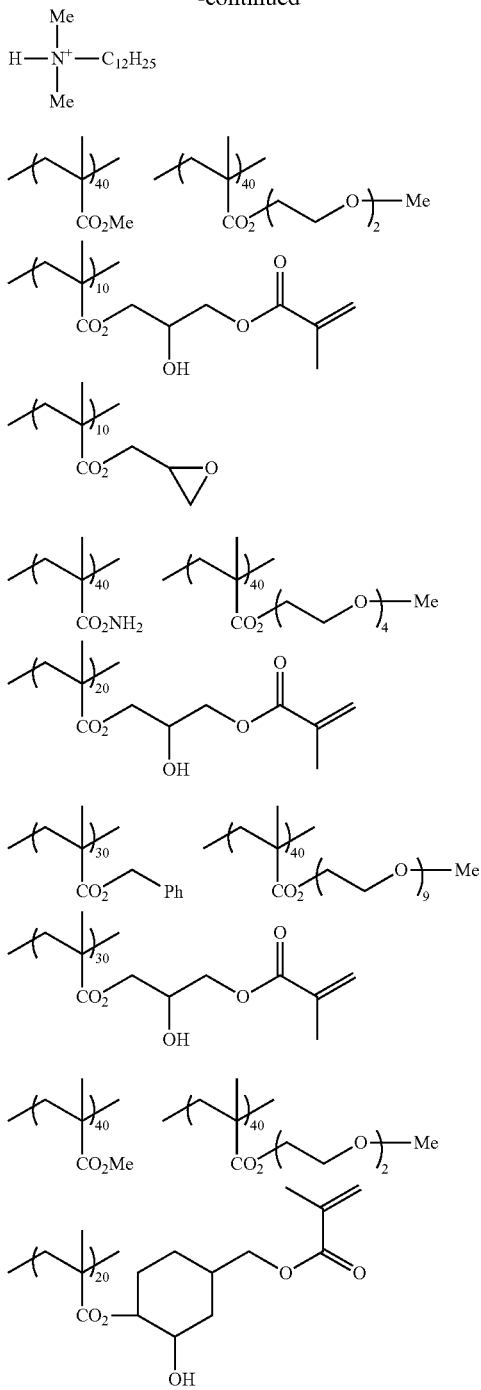

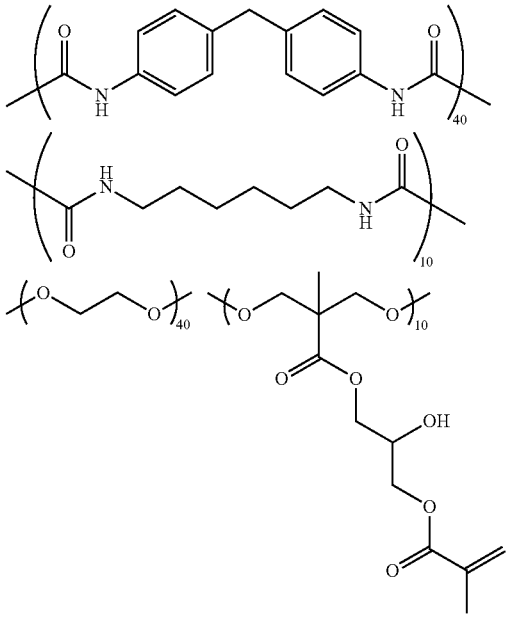

Regarding the molecular weight of the binder polymer, the weight average molecular weight (Mw) as a polystyrene equivalent value obtained by a GPC method is 2,000 or more, preferably 5,000 or more, and more preferably 10,000 to 300,000.

It is possible to jointly use hydrophilic polymers such as polyacrylate and polyvinyl alcohol described in JP2008-195018A as necessary. In addition, it is also possible to jointly use a lipophilic polymer and a hydrophilic polymer.

The binder polymer may be used singly or two or more binder polymers may be jointly used.

The content of the binder polymer is preferably 1% to 90% by mass and more preferably 5% to 80% by mass of the total solid content of the image-recording layer.

<Chain Transfer Agent>

The chain transfer agent contributes to the improvement of the printing resistance of a lithographic printing plate that is produced from the lithographic printing plate precursor.

The chain transfer agent is preferably a thiol compound, more preferably a thiol having 7 or more carbon atoms from the viewpoint of the boiling point (difficulty of being volatilized), and still more preferably a compound having a mercapto group on an aromatic ring (aromatic thiol compound). The thiol compound is preferably a monofunctional thiol compound.

Specific examples of the chain transfer agent include the following compounds:

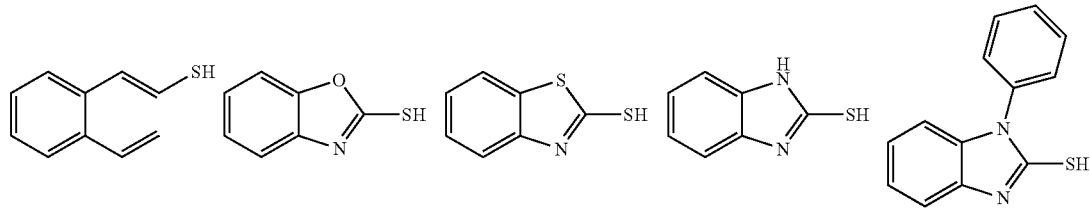

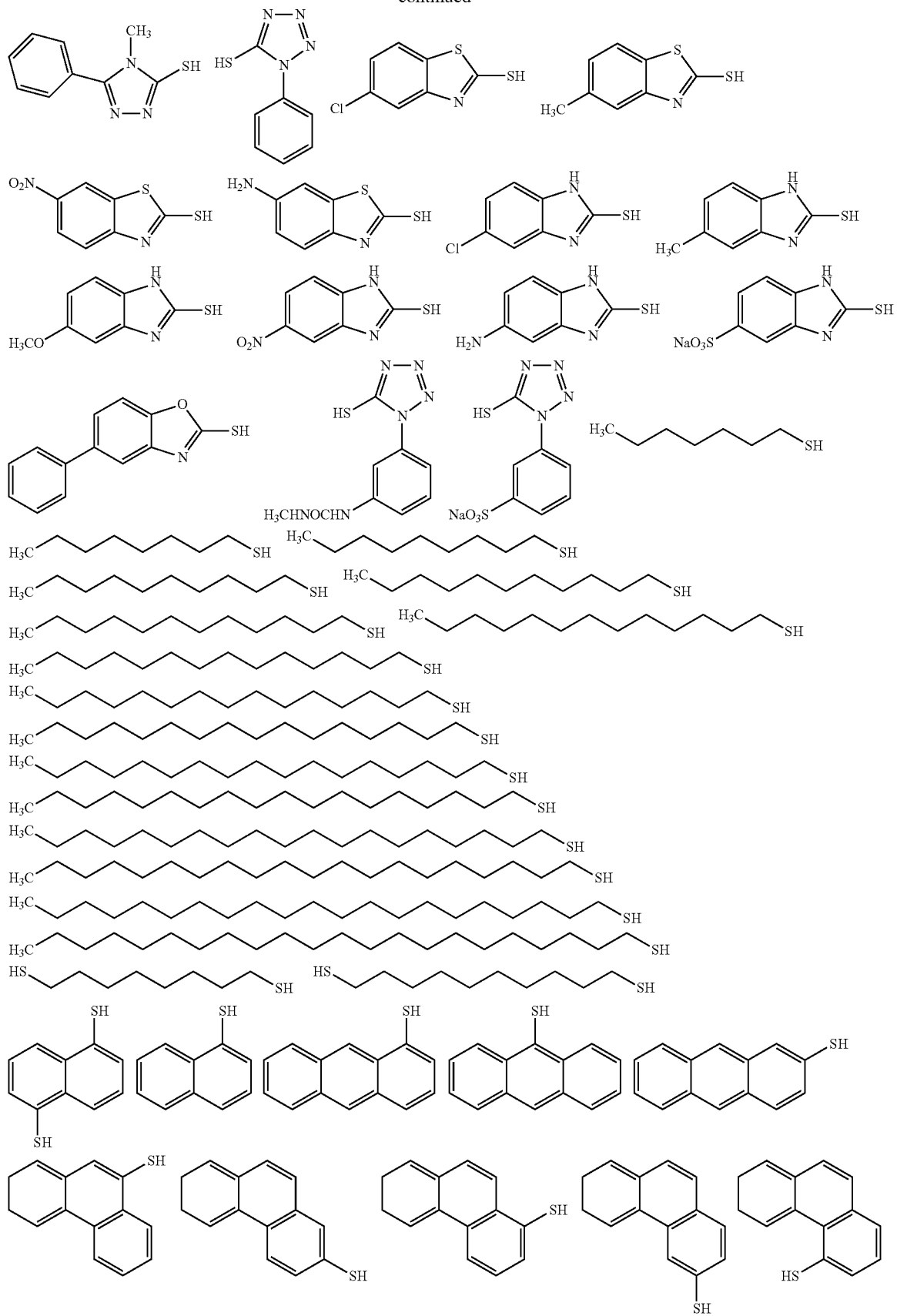
-continued

The chain transfer agent may be used singly or two or more chain transfer agents may be jointly used.

The content of the chain transfer agent is preferably 0.01% to 50% by mass, more preferably 0.05% to 40% by mass, and still more preferably 0.1% to 30% by mass of the total solid content of the image-recording layer.

<Low-Molecular-Weight Hydrophilic Compound>

The low-molecular-weight hydrophilic compound contributes to the improvement of the on-machine developability of the lithographic printing plate precursor without degrading the printing resistance of a lithographic printing plate that is produced from the lithographic printing plate precursor. The low-molecular-weight hydrophilic compound is preferably a compound having a molecular weight of smaller than 1,000, more preferably a compound having a molecular weight of smaller than 800, and still more preferably a compound having a molecular weight of smaller than 500.

As the low-molecular-weight hydrophilic compound, examples of water-soluble organic compounds include glycols such as ethylene glycol, diethylene glycol, triethylene glycol, propylene glycol, dipropylene glycol, and tripropylene glycol and ethers or ester derivative thereof, polyols such as glycerin, pentaerythritol, and tris(2-hydroxyethyl) isocyanurate, organic amines such as triethanolamine, diethanolamine, and monoethanolamine and salts thereof, organic sulfonic acids such as alkyl sulfonic acid, toluenesulfonic acid, and benzenesulfonic acid and salts thereof, organic sulfamic acids such as alkyl sulfamate and salts thereof, organic sulfuric acids such as alkyl sulfates and alkyl ether sulfates and salts thereof, organic phosphonic acids such as phenylphosphonic acid and salts thereof, organic carboxylic acids such as tartaric acid, oxalic acid, citric acid, malic acid, lactic acid, gluconic acid, and amino acid and salts thereof, betaines, and the like.

The low-molecular-weight hydrophilic compound is preferably at least one selected from polyols, organic sulfates, organic sulfonates, and betaines.

Specific examples of the organic sulfonates include alkyl sulfonates such as sodium n-butyl sulfonate, sodium n-hexyl sulfonate, sodium 2-ethylhexyl sulfonate, sodium cyclohexyl sulfonate, and sodium n-octyl sulfonate; alkyl sulfonates having ethylene oxide chains such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, sodium 5,8,11,14-tetraoxatetracosane-1-sulfonate; aryl sulfonates such as sodium benzene sulfonate, sodium p-toluenesulfonate, sodium p-hydroxybenzene sulfonate, sodium p-styrene sulfonate, sodium dimethyl isophthalate-5-sulfonate, sodium 1-naphthyl sulfonate, sodium 4-hydroxynaphthylsulfonate, sodium 1,5-naphthalene disulfonate, and trisodium 1,3,6-naphthalene trisulfonate; compounds described in Paragraphs 0026 to 0031 of JP2007-276454A and Paragraphs 0020 to 0047 of JP2009-154525A; and the like. The salts may be potassium salts or lithium salts.

Examples of the organic sulfates include sulfates of alkyls, alkenyls, alkynyls, aryls, or heterocyclic monoethers such as polyethylene oxides. The number of ethylene oxide units is preferably 1 to 4, and the salts are preferably sodium salts, potassium salts, or lithium salts. Specific examples thereof include compounds described in Paragraphs 0034 to 0038 of JP2007-276454A.

The betaines are preferably compounds in which the number of carbon atoms in hydrocarbon substituents into nitrogen atoms is 1 to 5, and specific examples thereof include trimethyl ammonium acetate, dimethyl propyl ammonium acetate, 3-hydroxy-4-trimethyl ammonio butyrate, 4-(1-pyridinio) butyrate, 1-hydroxyethyl-1-imidazolio acetate, trimethyl ammonium methanesulfonate, dimethyl propyl ammonium methanesulfonate, 3-trimethylammonio-1-propane sulfonate, 3-(1-pyridinio)-1-propane sulfonate, and the like.

Since the low-molecular-weight hydrophilic compound has a small structure in hydrophobic portions and barely has surfactant actions, there are no cases in which dampening water permeates exposed portions (image areas) in the image-recording layer and thus the hydrophobic property or membrane hardness of the image areas degrade, and it is possible to favorably maintain the ink-receiving property or printing resistance of the image-recording layer.

The low-molecular-weight hydrophilic compound may be used singly or two or more low-molecular-weight hydrophilic compounds may be jointly used.

The content of the low-molecular-weight hydrophilic compound is preferably 0.5% to 20% by mass, more preferably 1% to 15% by mass, and still more preferably 2% to 10% by mass of the total solid content of the image-recording layer.

<Sensitization Agent>

The sensitization agent contributes to the improvement of an ink-absorbing property of ink (hereinafter, also simply referred to as the "ink-absorbing property") in a lithographic printing plate that is produced from the lithographic printing plate precursor. As the sensitization agent, a phosphonium compound, a nitrogen-containing low-molecular-weight compound, an ammonium group-containing polymer, and the like are exemplified. Particularly, in a case in which the lithographic printing plate precursor contains an inorganic lamellar compound in the protective layer, these compounds function as surface coating agents for the inorganic lamellar compound and have a function of suppressing the ink-absorbing property from being degraded in the middle of printing due to the inorganic lamellar compound.

As the sensitization agent, a phosphonium compound, a nitrogen-containing low-molecular-weight compound, and an ammonium group-containing polymer are preferably jointly used as the sensitization agent, and a phosphonium compound, quaternary ammonium salts, and an ammonium group-containing polymer are more preferably jointly used.

Examples of a preferred phosphonium compound include phosphonium compounds described in JP2006-297907A and JP2007-050660A. Specific examples thereof include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, 1,9-bis(triphenylphosphonio)nonane=naphthalene-2,7-disulfonate, and the like.

Examples of the nitrogen-containing low-molecular-weight compound include amine salts and quaternary ammonium salts. In addition, examples thereof include imidazolinium salts, benzo imidazolinium salts, pyridinium salts, and quinolinium salts. Among these, quaternary ammonium salts and pyridinium salts are preferred. Specific examples thereof include tetramethylammonium=hexafluorophosphate, tetrabutylammonium=hexafluorophosphate, dodecyltrimethylammonium=p-toluene sulfonate, benzyltriethylammonium=hexafluorophosphate, benzyldimethyloctylammonium=hexafluorophosphate, benzyldimethyldodecylammonium=hexafluorophosphate, compounds described in Paragraphs 0021 to 0037 of JP2008-284858A and Paragraphs 0030 to 0057 of JP2009-090645A, and the like.

The ammonium group-containing polymer needs to have an ammonium group in the structure, and polymers including 5% by mol to 80% by mol of (meth)acrylate having ammonium groups in side chains as copolymerization components are preferred. Specific examples thereof include polymers described in Paragraphs 0089 to 0105 of JP2009-208458A.

In the ammonium group-containing polymer, the value of the reducing specific viscosity (unit: ml/g) obtained according to the measurement method described in JP2009-208458A is preferably 5 to 120, more preferably 10 to 110, and particularly preferably 15 to 100. In a case in which the reducing specific viscosity is converted to the weight average molecular weight (Mw), the mass average molar mass is preferably 10,000 to 150,000, more preferably 17,000 to 140,000, and particularly preferably 20,000 to 130,000.

Hereinafter, specific examples of the ammonium group-containing polymer will be described.

(1) 2-(Trimethylammonio)ethyl methacrylate=p-toluenesulfonate/3,6-dioxaheptyl methacrylate copolymer (molar ratio: 10/90, Mw: 45,000)

(2) 2-(Trimethylammonio)ethyl methacrylate=hexafluorophosphate/3,6-dioxaheptyl methacrylate copolymer (molar ratio: 20/80, Mw: 60,000)

(3) 2-(Ethyldimethylammonio)ethyl methacrylate=p-toluenesulfonate/hexyl methacrylate copolymer (molar ratio: 30/70, Mw: 45,000)

(4) 2-(Trimethylammonio)ethyl methacrylate=hexafluorophosphate/2-ethylhexyl methacrylate copolymer (molar ratio: 20/80, Mw: 60,000)

(5) 2-(Trimethylammonio)ethyl methacrylate=methylsulfate/hexyl methacrylate copolymer (molar ratio: 40/60, Mw: 70,000)

(6) 2-(Butyldimethylammonio)ethyl methacrylate=hexafluorophosphate/3,6-dioxaheptyl methacrylate copolymer (molar ratio: 25/75, Mw: 65,000)

(7) 2-(Butyldimethylammonio)ethyl acrylate=haxafluorophosphate/3,6-dioxaheptyl methacrylate copolymer (molar ratio: 20/80, Mw: 65,000)

(8) 2-(Butyldimethylammonio)ethyl methacrylate=13-ethyl-5,8,11-trioxa-1-heptadecanesulfonate/3,6-dioxaheptyl methacrylate copolymer (molar ratio: 20/80, Mw: 75,000)

(9) 2-(Butyldimethylammonio)ethyl methacrylate=haxafluorophosphate/3,6-dioxaheptyl methacrylate/2-hydroxy-3-methacryloyloxypropyl methacrylate copolymer (molar ratio: 15/80/5, Mw: 65,000)

The content of the sensitization agent is preferably 0.01% to 30% by mass, more preferably 0.1% to 15% by mass, and still more preferably 1% to 10% by mass of the total solid content in the image-recording layer.

<Other Components>

Furthermore, the image-recording layer is capable of containing, as other components, a surfactant, a polymerization inhibitor, a higher fatty acid derivative, a plasticizer, an inorganic particle, an inorganic lamellar compound, or the like. Specifically, it is possible to use individual components described in Paragraphs 0114 to 0159 of JP2008-284817A.

According to one form of the image-recording layer, the image-recording layer contains the infrared absorber, the polymerizable compound, the polymerization initiator, and at least one of the binder polymer and the polymer particle. The image-recording layer preferably further contains the chain transfer agent.

According to another form of the image-recording layer, the image-recording layer contains the infrared absorber, a thermally adhesive particle, and the binder polymer.

<Formation of Image-Recording Layer>

The image-recording layer is formed by, for example, as described in Paragraphs 0142 and 0143 of JP2008-195018A, appropriately dispersing or dissolving the necessary components described above in a well-known solvent so as to prepare a coating fluid, applying the coating fluid onto a support using a well-known method such as bar coating, and drying the coating fluid. The coating amount (solid content) of the image-recording layer after application and drying varies depending on applications, but is preferably approximately 0.3 to 3.0 g/m$^2$ from the viewpoint of obtaining a favorable sensitivity and favorable film characteristics of the image-recording layer.

In the formation of the image-recording layer, it is also possible to form a under layer of the image-recording layer using a coating fluid for the under layer of the image-recording layer containing the specific low-molecular-weight compound and form an upper layer of the image-recording layer using a coating fluid for the upper layer of the image-recording layer not containing the specific low-molecular-weight compound on the under layer of the image-recording layer, thereby producing the image-recording layer.

The coating fluid for the under layer of the image-recording layer may include, in addition to the specific low-molecular-weight compound, a polymer that functions as a binder of the under layer of the image-recording layer, a chelating agent, a surfactant, or the like. As the polymer that functions as a binder, a polymer that is used in an undercoat layer described below can be exemplified. The chelating agent is used for the purpose of preventing the temporal contamination of the non-image area or the like, and, for example, CHELEST series (Chelest Corporation) is exemplified. The surfactant is used for the purpose of improving the coating property by a decrease in surface tension, and, for example, EMALEX series (Nihon Emulsion Co., Ltd.) is exemplified.

The coating fluid for the under layer of the image-recording layer may include, in addition to the specific low-molecular-weight compound, the components of the image-recording layer.

The coating fluid for the under layer of the image-recording layer can be prepared by dissolving the respective components described above in water. The under layer of the image-recording layer can be formed by applying the coating fluid for the under layer of the image-recording layer using a well-known method such as bar coater application and drying the coating fluid. The coating amount (solid content) of the under layer of the image-recording layer after drying is preferably 5 to 200 mg/m$^2$ and more preferably 10 to 150 mg/m$^2$. The coating amount (solid content) of the specific low-molecular-weight compound is preferably 1 to 190 mg/m$^2$ and more preferably 10 to 150 mg/m$^2$.

The coating fluid for the upper layer of the image-recording layer needs to have a constitution including the components of the image-recording layer excluding the specific low-molecular-weight compound. The coating fluid for the upper layer of the image-recording layer can be formed according to the method described regarding the formation of the image-recording layer. The coating amount (solid content) of the upper layer of the image-recording layer after drying is preferably 100 to 4,000 mg/m$^2$ and more preferably 300 to 3,000 mg/m$^2$.

In the image-recording layer obtained by forming the under layer of the image-recording layer using the coating fluid for the under layer of the image-recording layer containing the specific low-molecular-weight compound and forming the upper layer of the image-recording layer using the coating fluid for the upper layer of the image-recording layer not containing the specific low-molecular-weight compound on the under layer of the image-recording layer, it is admitted that the specific low-molecular-weight compound is present not only in the under layer of the image-recording layer but also in the upper layer of the image-recording layer. This is considered to arise from the fact that some of the specific low-molecular-weight compound diffuses from the under layer of the image-recording layer to the upper layer of the image-recording layer. The fact that the specific low-molecular-weight compound is present not only in the under layer of the image-recording layer but also in the upper layer of the image-recording layer can be checked using a method described below.

The amount of an element derived from the support adsorptive group of the specific low-molecular-weight compound that is included in the image-recording layer can be measured using the following method. That is, a cross section of the lithographic printing plate precursor is linearly analyzed in the depth direction using STEM-EDS. The element derived from the support adsorptive group (for example, phosphorus) is measured until the element can be recognized as a signal. As a support interface (zero point), a depth closest to an image-recording layer side at which the intensity of aluminum (Al) reaches 80% of the maximum value is selected. The amount of the element is determined from the STEM-EDS measurement data using the Cliff-Lorimer method. Next, for a support obtained by removing the film from the lithographic printing plate precursor using water and an organic solvent, the element is measured in the same manner, and the amount of the element derived from the support adsorptive group included in the support is determined. A difference between the amount of the element obtained by the measurement of the lithographic printing plate precursor and the amount of the element obtained by the measurement of the above-described support is regarded as the amount of the element derived from the support adsorptive group of the specific low-molecular-weight compound that is included in the image-recording layer.

The present invention also includes an on-machine development-type lithographic printing plate precursor having an image-recording layer on an aluminum support having an anode oxide film, in which the end portion of the lithographic printing plate precursor has a shear droop shape, the image-recording layer contains a compound having a support adsorptive property, having a molecular weight of 1,000 or less, and not having an unsaturated double bond group in a molecule, the content of the compound is substantially the same in the plane of the image-recording layer, and, in the case of linearly analyzing a cross section of the lithographic printing plate precursor in a depth direction using STEM-EDS, 0.5% by mass or more of an element derived from the support-adsorptive group is present at any depth toward the image-recording layer side from the interface between the aluminum support and the image-recording layer.

The on-machine development-type lithographic printing plate precursor is an on-machine development-type lithographic printing plate precursor in which edge contamination is prevented without degrading the characteristics such as the image-forming property of the end portion and on-machine developability.

The amount of the element derived from the support adsorptive group of the specific low-molecular-weight compound that is included in the image-recording layer is preferably 0.8% by mass or more from the viewpoint of an edge contamination-preventing property.

The on-machine development-type lithographic printing plate precursor according to the embodiment of the present invention may have an undercoat layer (also referred to as the interlayer in some cases) between the image-recording layer and the support and a protective layer (also referred to as the overcoat layer in some cases) on the image-recording layer.

[Undercoat Layer]

The undercoat layer strengthens adhesiveness between the support and the image-recording layer in exposed portions and facilitates peeling the support and the image-recording layer in non-exposed portions, and thus the undercoat layer contributes to improving developability without impairing printing resistance. In addition, in the case of exposure using infrared lasers, the undercoat layer functions as an adiabatic layer and thus has an effect of preventing the sensitivity from being degraded due to the diffusion of heat generated by exposure in the support.

Examples of compounds that can be used for the undercoat layer include polymers having adsorbent groups that can be adsorbed to the surface of the support and hydrophilic groups. In order to improve adhesiveness to the image-recording layer, polymers having adsorbent groups and hydrophilic groups and further having crosslinking groups are preferred. The compounds that can be used for the undercoat layer may be low-molecular-weight compounds or polymers. The compounds that can be used for the undercoat layer may be used in a mixed form of two or more kinds as necessary.

In a case in which the compounds that are used for the undercoat layer are polymers, copolymers of monomers having adsorbent groups, monomers having hydrophilic groups, and monomers having crosslinking groups are preferred.

The adsorbent groups that can be adsorbed to the surface of the support are preferably phenolic hydroxy groups, carboxy groups, $-PO_3H_2$, $-OPO_3H_2$, $-CONHSO_2-$, $-SO_2NHSO_2-$, $-COCH_2COCH_3$. The hydrophilic groups are preferably sulfo groups or salts thereof and salts of carboxy groups. The crosslinking groups are preferably acrylic groups, methacryl groups, acrylamide groups, methacrylamide groups, allyl groups, and the like.

The polymers may have crosslinking groups introduced due to the formation of salts between polar substituents of the polymers and compounds having substituents having opposite charges of the above-described polar substituents and ethylenic unsaturated bonds and may be further copolymerized with monomers other than the above-described monomers, preferably, hydrophilic monomers.

Specifically, preferred examples thereof include silane coupling agents having ethylenic double bond reactive groups that are capable of addition polymerization described in JP1998-282679A (JP-H10-282679A) and phosphorus compounds having ethylenic double bond reactive groups described in JP1990-304441A (JP-H02-304441A). Low-molecular-weight or high-molecular-weight compounds having crosslinking groups (preferably ethylenic unsaturated bond groups), functional groups that interact with the surface of the support, and hydrophilic groups described in JP2005-238816A, JP2005-125749A, JP2006-239867A, and JP2006-215263A are also preferably used.

More preferred examples thereof include high-molecular-weight polymers having adsorbent groups that can be adsorbed to the surface of the support, hydrophilic groups, and crosslinking groups described in JP2005-125749A and JP2006-188038A.

The content of ethylenic unsaturated bond groups in the polymer that is used in the undercoat layer is preferably 0.1 to 10.0 mmol and more preferably 0.2 to 5.5 mmol per gram of the polymer.

The mass average molecular weight (Mw) of the polymer that is used in the undercoat layer is preferably 5,000 or higher and more preferably 10,000 to 300,000.

In addition to the above-described compounds for the undercoat layer, the undercoat layer may also include a chelating agent, secondary or tertiary amines, a polymerization inhibitor, compounds having amino groups or functional groups having a polymerization-inhibiting function and groups that interact with the surfaces of supports (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylenediamine diacetic acid, hydroxyethyl iminodiacetic acid, and the like), and the like in order to prevent contamination over time.

The undercoat layer is formed using well-known coating methods. The coating amount (solid content) of the undercoat layer is preferably 0.1 to 100 mg/m$^2$ and more preferably 1 to 30 mg/m$^2$.

[Protective Layer]

The protective layer has a function of suppressing image formation-impairing reactions caused by the shielding of oxygen and additionally has a function of preventing the generation of damage in the image-recording layer and abrasion prevention during exposure using high-illuminance lasers.

Protective layers having the above-described characteristics are described in, for example, the specification of US3458311A and JP1980-049729B (JP-S55-049729B). As poor oxygen-transmissible polymers that can be used for the protective layer, it is possible to appropriately select and use any one of water-soluble polymers and water-insoluble polymers, and, if necessary, it is also possible to use two or more polymers in a mixed form. Specific examples thereof include polyvinyl alcohols, modified polyvinyl alcohols, polyvinyl pyrrolidone, water-soluble cellulose derivatives, poly(meth)acrylonitrile, and the like.

As the modified polyvinyl alcohols, acid-modified polyvinyl alcohols having carboxy groups or sulfo groups are preferably used. Specific examples thereof include modified-polyvinyl alcohols described in JP2005-250216A and JP2006-259137A.

The protective layer preferably includes inorganic lamellar compounds in order to enhance an oxygen-shielding property. The inorganic lamellar compound refers to a particle having thin flat plate shapes, and examples thereof include mica groups such as natural mica and synthetic mica, talc represented by Formula 3MgO.4SiO.H$_2$O, taeniolite, montmorillonite, saponite, hectorite, zirconium phosphate, and the like.

The inorganic lamellar compounds that can be preferably used are mica compounds. Examples of mica compounds include mica groups such as natural mica and synthetic mica represented by Formula: $A(B, C)_{2-5}D_4O_{10}(OH, F, O)_2$ [here, A is any of K, Na, and Ca, B and C are any of Fe (II), Fe (III), Mn, Al, Mg, and V, and D is Si or Al.].

In the mica groups, examples of natural mica include white mica, soda mica, gold mica, black mica, and lepidolite. Examples of synthetic mica include non-swelling mica such as fluorphlogopite $KMg_3(AlSi_3O10)F_2$, potassium tetrasilic mica $KMg_{2.5}(Si_4O_{10})F_2$, and, Na tetrasilylic mica $NaMg_{2.5}(Si_4O_{10})F_2$, swelling mica such as Na or Li taeniolite $(Na, Li)Mg_2Li(Si_4O_{10})F_2$, montmorillonite-based Na or Li hectorite $(Na, Li)_{1/8}Mg_{2/5}Li_{1/8}(Si_4O_{10})F_2$, and the like. Furthermore, synthetic smectite is also useful.

In the present invention, among the above-described mica compounds, fluorine-based swelling mica is particularly useful. That is, swelling synthetic mica has a laminate structure consisting of unit crystal lattice layers having a thickness of approximately 10 angstroms to 15 angstroms, and metal atoms in lattices are more actively substituted than in any other clay minerals. As a result, positive charges are deficient in the lattice layers, and cations such as $Li^+$, $Na^+$, $Ca^{2+}$, and $Mg^{2+}$ are adsorbed between the layers in order to compensate for the deficiency. Cations interposed between the layers are referred to as exchangeable cations and are exchangeable with various cations. Particularly, in a case in which the cations between the layers are $Li^+$ and $Na^+$, the ionic radii are small, and thus the bonds between lamellar crystal lattices are weak, and mica is significantly swollen by water. In a case in which shear is applied in this state, mica easily cleavages and forms a stable sol in water. The above-described tendency of swelling synthetic mica is strong, and the swelling synthetic mica is particularly preferably used.

From the viewpoint of diffusion control, regarding the shapes of the mica compounds, the thickness is preferably thin, and the planar size is preferably large as long as the smoothness and active light ray-transmitting properties of coated surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from projection views obtained from the microphotograph of the particle. As the aspect ratio increases, the obtained effect becomes stronger.

Regarding the particle diameters of the mica compound, the average long diameter thereof is preferably 0.3 to 20 μm, more preferably 0.5 to 10 μm, and particularly preferably 1 to 5 μm. The average thickness of the particles is preferably 0.1 μm or smaller, more preferably 0.05 μm or smaller, and particularly preferably 0.01 μm or smaller. Specifically, for example, in the case of swelling synthetic mica which is a typical compound, a preferred aspect has a thickness of approximately 1 to 50 nm and a surface size (long diameter) of approximately 1 to 20 μm.

The content of the inorganic lamellar compound is preferably 0% to 60% by mass and more preferably 3% to 50% by mass of the total solid content of the protective layer. Even in a case in which multiple kinds of inorganic lamellar compounds are jointly used, the total amount of the inorganic lamellar compounds is preferably the above-described content. In a case in which the total amount is in the above-described range, the oxygen-shielding property improve, and a favorable sensitivity can be obtained. In addition, the degradation of the ink-absorbing property can be prevented.

The protective layer may include well-known additives such as a plasticizer for imparting flexibility, a surfactant for improving a coating property, and an inorganic fine particle for controlling a sliding property on the surface. In addition, the sensitization agent described in the section of the image-recording layer may be added to the protective layer.

The protective layer is formed using a well-known coating method. The coating amount of the protective layer (solid content) is preferably 0.01 to 10 g/m², more preferably 0.02 to 3 g/m², and particularly preferably 0.02 to 1 g/m².

The on-machine development-type lithographic printing plate precursor according to the embodiment of the present invention has a shear droop shape in the end portion. The shear droop shape preferably has a shear droop amount X of 25 to 150 μm and a shear droop width Y of 70 to 300 μm.

FIG. 1 is a view schematically illustrating a cross-sectional shape of the end portion of the lithographic printing plate precursor.

In FIG. 1, a lithographic printing plate precursor 1 has shear droop 2 in the end portion. A distance X between an upper end (a boundary point between the shear droop 2 and an end surface 1c) of the end surface 1c of the lithographic printing plate precursor 1 and an extension line from an image-recording layer surface (a protective layer surface in a case in which the protective layer is formed) 1a is referred to as the "shear droop amount", and a distance Y between a point at which the image-recording layer surface 1a of the lithographic printing plate precursor 1 begins to droop and the extension line from the end surface 1c is referred to as the "shear droop width".

The shear droop amount of the end portion is preferably 35 μm or more and more preferably 40 μm or more. The upper limit of the shear droop amount is preferably 150 μm from the viewpoint of preventing the deterioration of the on-machine developability due to the deterioration of the end portion surface state. In a case in which the on-machine developability deteriorates, ink is attached to the remaining image-recording layer, which causes the generation of edge contamination. In a case in which the shear droop amount is too small, it becomes easy for the ink attached to the end portion to be transferred to a blanket, which causes the generation of edge contamination. In a case in which the range of the shear droop amount is 25 to 150 μm and the shear droop width is small, the generation of a crack in the end portion increases, and printing ink remaining in the crack causes edge contamination. From such a viewpoint, the shear droop width is preferably in a range of 70 to 300 μm and more preferably in a range of 80 to 250 μm. The ranges of the shear droop amount and the shear droop width do not depend on the edge shape of a support surface 1b of the lithographic printing plate precursor 1.

Generally, in the end portion of the lithographic printing plate precursor 1, similar to the image-recording layer surface 1a, drooping occurs in a boundary B between the image-recording layer and the support and the support surface 1b.

The end portion having the shear droop shape can be formed by adjusting, for example, the cutting condition of the lithographic printing plate precursor.

Specifically, the end portion can be formed by adjusting, in a slitter that is used for the cutting of the lithographic printing plate precursor, a gap between an upper side cutting blade and a lower side cutting blade, a jamming amount, a blade tip angle, or the like.

Figure 2:
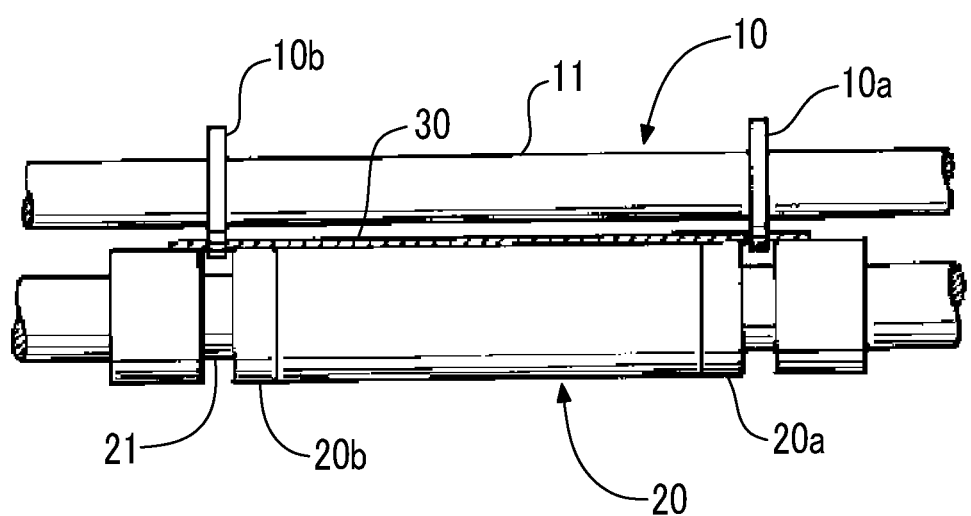
FIG. 2 is a conceptual view showing an example of a cur portion of a slitter device.

For example, FIG. 2 is a conceptual view illustrating a cutting portion of the slitter. In the slitter, a pair of upper and lower cutting blades 10 and 20 are disposed on the right and left side. The cutting blades 10 are 20 are made of a round blade on a disk, upper side cutting blades 10a and 10b are concentrically supported by a rotary shaft 11, and lower side cutting blades 20a and 20b are concentrically supported by a rotary shaft 21, respectively. The upper side cutting blades 10a and 10b and the lower side cutting blades 20a and 20b rotate in opposite directions. A lithographic printing plate precursor 30 is passed through the upper side cutting blades 10a and 10b and the lower side cutting blades 20a and 20b and is cut to a predetermined width. An end portion having a shear droop shape can be formed by adjusting the gap between the upper side cutting blade 10a and the lower side cutting blade 20a and the gap between the upper side cutting blade 10b and the lower side cutting blade 20b in the cutting portion of the slitter.

In the on-machine development-type lithographic printing plate precursor according to the embodiment of the present invention, from the viewpoint of further suppressing edge contamination, the area ratio of the crack present on the surface of the anode oxide film in a region corresponding to the shear droop width Y is preferably 10% or less.

Here, the region corresponding to the shear droop width Y refers to a region from an intersection point of the extension line from the image-recording layer surface (the protective layer surface in a case in which the protective layer is formed) 1a and the extension line from the end surface 1c through a point at which the extension line from 1a comes into contact with the image-recording layer surface (the protective layer surface in a case in which the protective layer is formed) in FIG. 1.

The area ratio of the crack present on the surface of the anode oxide film is computed using the following method.

The constituent layers (the undercoat layer, the image-recording layer, and the protective layer) of the lithographic printing plate precursor are removed using Plasma Reactor PR300 manufactured by Yamato Scientific Co., Ltd. A 3 nm-thick Pt—Pd film is deposited on the surface of the anode oxide film on the exposed aluminum support and is made to be conductive, thereby creating a specimen. This specimen is SEM-observed using an S-4800 type field emission scanning electron microscope (FE-SEM) manufactured by Hitachi High-Technologies Corporation at an accelerated voltage of 30 kV, and a continuous photograph is acquired from the end portion toward the central portion at an observation magnification of 1,500 times, thereby obtaining a 150×50 μm image. From this image, a crack shape is extracted using a difference in brightness between the crack portion and the surface of the anode oxide film obtained by image processing software "Image J" and is binarized, and the proportion of a crack in the 150×50 μm range is computed and regarded as the area ratio of the crack.

The area ratio of the crack is particularly preferably 6% or less from the viewpoint of preventing the generating of edge contamination.

In order to adjust the area ratio of the crack present on the surface of the anode oxide film in the region corresponding to the shear droop width Y to 10% or less, the anode oxide film amount of the anode oxide film is preferably controlled to be in a range of 0.5 to 5.0 g/m². The anode oxide film amount is more preferably controlled to be in a range of 0.8 to 1.2 g/m² from the viewpoint of further suppressing edge contamination.

The anode oxide film amount of the anode oxide film is computed using the following method.

The constituent layers (the undercoat layer, the image-recording layer, and the protective layer) of the lithographic printing plate precursor are removed using Plasma Reactor PR300 manufactured by Yamato Scientific Co., Ltd. The surface of the anode oxide film on the exposed aluminum support is measured using an X-ray fluorescence analyzer (ZSX Primus II manufactured by Rigaku Corporation), and the anode oxide film amount (g/m²) of the anode oxide film is computed using a separately-produced calibration curve. The calibration curve is produced from the relationship between the intensity of a Compton-scattered ray obtained from the X-ray fluorescence analyzer and the anode oxide film amount computed using a Mason method. In order to increase the measurement accuracy of the Mason method, a new liquid is used as the entire Mason liquid. The conditions of the X-ray fluorescence analysis are as described below. X-ray tube: Rh, measurement spectrum: RhLα, tube voltage: 50 kV, tube current: 60 mA, slit: S2, dispersive crystal: Ge, inspector: PC, analysis area: 30 mmϕ), peak location (2 θ): 89.510 deg., background (2 θ): 87.000 deg. and 92.000 deg., and cumulative time: 60 seconds/sample In order to control the anode oxide film amount of the anode oxide film, for example, a method in which the electrolysis time in the anodization process is adjusted is exemplified.

In order to adjust the area ratio of the crack present on the surface of the anode oxide film in the region corresponding to the shear droop width Y to 10% or less, the average diameter of micropores present on the surface of the anode oxide film is preferably controlled to be in a range of 5 to 35 nm.

The average diameter of the micropores in the anode oxide film is computed using the following method.

The constituent layers (the undercoat layer, the image-recording layer, and the protective layer) of the lithographic printing plate precursor are removed using Plasma Reactor PR300 manufactured by Yamato Scientific Co., Ltd. A 3 nm-thick carbon or Pt—Pd film is deposited on the surface of the anode oxide film on the exposed aluminum support and is made to be conductive, thereby creating a specimen. A continuous photograph of this specimen is acquired using an S-4800 type field emission scanning electron microscope (FE-SEM) manufactured by Hitachi High-Technologies Corporation from the end portion toward the central portion at an observation magnification of 150,000 times, thereby obtaining four 400×600 nm images. The diameters of 90 micropores present in these four images are measured and averaged, thereby obtaining the average diameter of the micropores. In a case in which the shape of the micropore is not circular, a circle having the same projected area as the projected area of the micropore is assumed, and the diameter of the circle is regarded as the diameter of the micropore.

In a case in which the micropore has a large-diameter pore portion and a small-diameter pore portion, the surfaces of the large-diameter portion portions and the surfaces of the small-diameter pore portions are observed in the four images (N=4) using FE-SEM (magnification: 150,000 times), and the diameters of the micropores (the large-diameter pore portions and the small-diameter pore portions) present in a 400×600 nm² range in the obtained four images are measured and averaged, thereby obtaining the average diameter of the respective micropores. In a case in which the depth of the large-diameter pore portion is deep, and it is difficult to measure the diameter of the small-diameter pore portion, the above-described operation is carried out after an upper portion of the anode oxide film is cut.

In order to control the average diameter of the micropores in the anode oxide film, for example, a method in which the processing time in the pore widening process is adjusted is exemplified.

The on-machine development-type lithographic printing plate precursor according to the embodiment of the present invention has a characteristic of being capable of preventing the generation of edge contamination without degrading the characteristics such as the image-forming property of the end portion and on-machine developability due to the fact that the end portion has the shear droop shape and the specific low-molecular-weight compound is contained in the image-recording layer.

Furthermore, the on-machine development-type lithographic printing plate precursor according to the embodiment of the present invention has a characteristic of being capable of preventing the generation of edge contamination without carrying out a hydrophilization process such as the application of a coating fluid containing a water-soluble compound to the end portion.

[Method for Producing Lithographic Printing Plate]

A method for producing a lithographic printing plate according to the embodiment of the present invention includes a step of image-exposing the lithographic printing plate precursor according to the embodiment of the present invention (exposure step), and a step of removing a non-exposed portion of the image-recording layer using at least one of printing ink or dampening water on a printer from the lithographic printing plate precursor that has been image-exposed (on-machine development step).

[Exposure Step]

Image-exposure is preferably carried out using a method in which digital data are scanned and exposed using an infrared laser or the like.

The wavelength of the exposure light source is preferably 750 nm to 1,400 nm. The light source having a wavelength of 750 nm to 1,400 nm is preferably a solid-state laser or a semiconductor laser that radiates infrared rays. The exposure mechanism may be any one of in-plane drum methods, external surface drum methods, flat head methods, and the like.

The exposure step can be carried out using platesetters or the like and well-known methods. In addition, exposure may be carried out on a printer using a printer including an exposure device after the lithographic printing plate precursor is mounted on the printer.

[On-Machine Development Step]

In the on-machine development step, in a case in which printing is initiated by supplying printing ink and dampening water on the printer without carrying out any development processes on the lithographic printing plate precursor that has been exposed in an image pattern, non-exposed portions on the lithographic printing plate precursor are removed at the initial stage of printing, and accordingly, the hydrophilic surface of the support is exposed, and non-image areas are formed. As the printing ink and the dampening water, well-known printing ink and dampening water for lithographic printing are used. Any of printing ink and dampening water may be first supplied to the surface of the lithographic printing plate precursor, but it is preferable to first supply printing ink from the viewpoint of preventing contamination by the components of the image-recording layer from which dampening water is removed.

In the above-described manner, the lithographic printing plate precursor is on-machine-developed on an off-set printer and is used as it is for printing a number of pieces of paper.

The method for producing a lithographic printing plate according to the embodiment of the present invention may also include other well-known steps in addition to the above-described steps. Examples of other steps include a plate-inspecting step of checking a position, a direction, or the like of a lithographic printing plate precursor before each step, or a checking step of checking a printed image after an on-machine development step.

EXAMPLES

Hereinafter, the present invention will be described in detail using examples, but the present invention is not limited thereto. Meanwhile, for polymer compounds, unless particularly otherwise described, the molecular weight refers to the mass average molecular weight (Mw) converted to a polystyrene equivalent value by a gel permeation chromatography (GPC) method, and the ratio of a repeating unit refers to the molar percentage. In addition, "parts" and "%" indicates "parts by mass" and "% by mass" unless particularly otherwise described.

Examples 1 to 21 and Comparative Examples 1 to 3

<Production of Support (1)>

Individual processes (a) to (g) described below were sequentially carried out on an aluminum plate, thereby producing an aluminum support having an anode oxide film (support (1)). Between all process steps, a water-washing process was carried out.

(a) Alkali Etching Process

An aqueous solution having a concentration of sodium hydroxide of 25% by mass, a concentration of an aluminum ion of 100 g/L, and a temperature of 60° C. was blown to a 0.3 mm-thick aluminum plate (material: JIS 1052) from a spray tube, thereby carrying out an etching process. The etching amount on a surface of the aluminum plate on which an electrochemical roughening process was carried out was 3 g/m².

(b) Desmut Process

A sulfuric acid aqueous solution (concentration: 300 g/L) having a temperature of 35° C. was blown to the aluminum plate from the spray tube for five seconds, thereby carrying out a desmut process.

(c) Electrochemical Roughening Process

An electrochemical roughening process was continuously carried out on the aluminum plate using an electrolytic solution (liquid temperature: 35° C.) provided with a concentration of an aluminum ion of 4.5 g/L by dissolving aluminum chloride in a 1% by mass hydrochloric acid aqueous solution using a 60 Hz alternating-current power supply and a flat cell-type electrolysis tank. As the waveform of the alternating-current power supply, a sinusoidal wave was used. In the electrochemical roughening process, the current density during an anode reaction of the aluminum plate at the peak of the alternating current was 30 A/dm². The ratio between the total of the electric quantities during the anode reaction of the aluminum plate and the total of the electric quantities during a cathode reaction was 0.95. The electric quantity was 480 C/dm² in terms of the total of the electric quantities during the anode reaction of the aluminum plate. An electrolytic solution was circulated using a pump, thereby being stirred in the electrolysis tank.

(d) Alkali Etching Process

An aqueous solution having a concentration of sodium hydroxide of 5% by mass, a concentration of an aluminum ion of 5 g/L, and a temperature of 35° C. was blown to the aluminum plate from the spray tube, thereby carrying out an etching process. The etching amount on the surface of the aluminum plate on which the electrochemical roughening process was carried out was 0.05 g/m².

(e) Desmut Process

An aqueous solution having a concentration of sulfuric acid of 300 g/L, a concentration of an aluminum ion of 5 g/L, and a temperature of 35° C. was blown to the aluminum plate from the spray tube for five seconds, thereby carrying out a desmut process.

(f) Anodization Process

A 1,000 nm-thick direct-current anode oxide film was provided under conditions of 40° C. and a current density of 15 A/dm² using an electrolytic solution of 15% by mass of sulfuric acid (including 0.5% by mass of an aluminum ion). After that, water washing was carried out by spraying.

(g) Pore Widening Process

An alkali process was carried out on the aluminum plate using a NaOH 5% aqueous solution at 30° C. for two seconds, thereby producing a support (1). The average diameter of micropores in the anode oxide film on the support (1) was 15 nm. The average diameter of micropores in the anode oxide film is a numeric value computed according to the above-described method (which will also be true below). The value of brightness L* of the surface of the anode oxide film was 80, and the steepness a45 was 23%.

<Production of Support (2)>

A support (2) was produced in the same manner as in the production of the support (1) except for the fact that, in the production of the support (1), the thickness of the anode oxide film was set to 750 nm by adjusting the time of the anodization process. The average diameter of micropores in the anode oxide film on the support (2) was 15 nm. The value of brightness L* of the surface of the anode oxide film was 80, and the steepness a45 was 23%.

<Production of Support (3)>

A support (3) was produced in the same manner as in the production of the support (1) except for the fact that, in the production of the support (1), the thickness of the anode oxide film was set to 500 nm by adjusting the time of the anodization process. The average diameter of micropores in the anode oxide film on the support (3) was 15 nm. The value of brightness L* of the surface of the anode oxide film was 80, and the steepness a45 was 23%.

<Production of Support (4)>

A support (4) was produced in the same manner as in the production of the support (1) except for the fact that, in the production of the support (1), the anodization process (f) was changed as described below, and the pore widening process (g) was not carried out. The average diameter of micropores in the anode oxide film on the support (4) was 35 nm. The value of brightness L* of the surface of the anode oxide film was 83, and the steepness a45 was 23%.

(f) Anodization Process

A 500 nm-thick direct-current anode oxide film was provided under conditions of 38° C. and a current density of 15 A/dm² using an electrolytic solution of a 22% by mass phosphoric acid aqueous solution. After that, water washing was carried out by spraying.

<Formation of Image-Recording Layer (1)>

A coating fluid for an image-recording layer (1) was applied onto a support by means of bar coating and was dried in an oven at 100° C. for 60 seconds, thereby forming an image-recording layer (1) having a dried coating amount of 1.0 g/m².

The coating fluid for the image-recording layer (1) was prepared by mixing and stirring the following photosensitive liquid (1) and the following micro gel liquid immediately before the coating.

<Photosensitive Liquid (1)>

| | |
|---|---|
| Binder polymer (1) [the following structure] | 0.240 parts |
| Polymerization initiator (1) [the following structure] | 0.245 parts |
| Infrared absorber (1) [the following structure] | 0.046 parts |
| Borate compound | 0.010 parts |
| TPB [the following structure] | |

-continued

| | |
|---|---|
| Polymerizable compound | 0.192 parts |
| Tris(acryloyloxyethyl)isocyanurate | |
| (NK ester A-9300, manufactured by Shin-Nakamura Chemical Co., Ltd.) | |
| Low-molecular-weight hydrophilic compound | 0.062 parts |
| Tris(2-hydroxyethyl)isocyanurate | |
| Low-molecular-weight hydrophilic compound (1) (the following structure) | 0.050 parts |
| Fluorine-based surfactant (1) [the following structure] | 0.008 parts |

Specific low-molecular-weight compound or comparative compound [compound shown in Table 1]
[Amount shown in Table 1]

| | |
|---|---|
| 2-Butanone | 1.091 parts |
| 1-Methoxy-2-propanol | 8.609 parts |

<Micro Gel Liquid>

| | |
|---|---|
| Micro gel (1) | 2.640 parts |
| Distilled water | 2.425 parts |

The structures of the binder polymer (1), the polymerization initiator (1), the infrared absorber (1), TPB, the low-molecular-weight hydrophilic compound (1), and the fluorine-based surfactant (1) which were used for the photosensitive liquid (1) will be illustrated below.

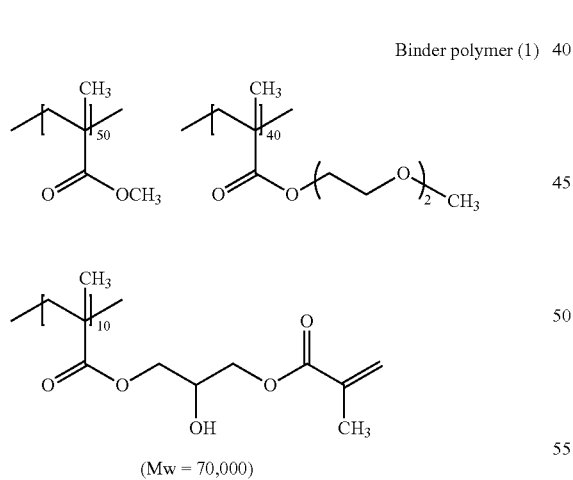

Binder polymer (1)

(Mw = 70,000)

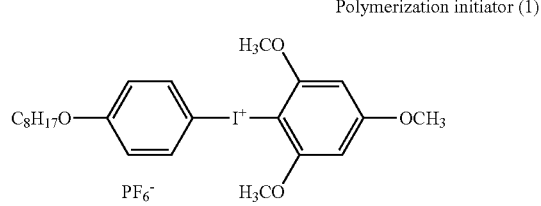

Polymerization initiator (1)

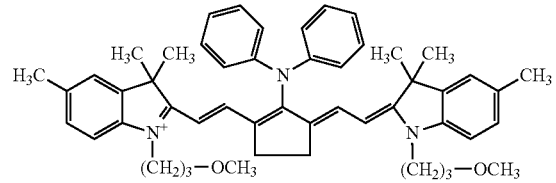

Infrared absorber (1)

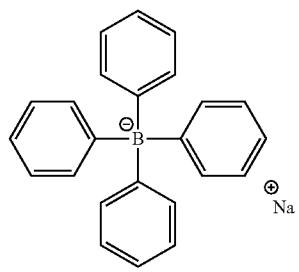

TPB

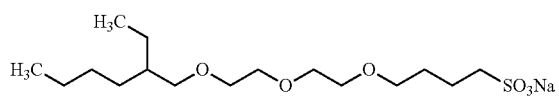

Low-molecular-weight hydrophilic compound (1)

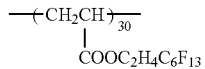

Fluorine-based surfactant (1)

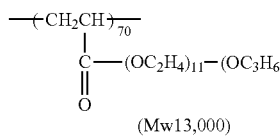

(Mw 13,000)

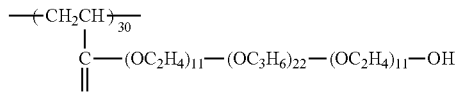

Binder polymer (1)

Fluorine-based surfactant (1)
(Mw 13,000)

A method for preparing the micro gel (1) used in the micro gel liquid will be described below.

<Preparation of Polyhydric Isocyanate Compound (1)>

Bismuth tris(2-ethylhexanoate) (NEOSTAN U-600, manufactured by Nitto Kasei Co., Ltd.) (43 mg) was added to an ethyl acetate (25.31 g) suspended solution of isophorone diisocyanate (17.78 g, 80 mmol) and the following polyhydric phenol compound (1) (7.35 g, 20 mmol), and the components were stirred. The reaction temperature was set to 50° C. in a case in which the generation of heat settled, and the components were stirred for three hours, thereby obtaining an ethyl acetate solution of a polyhydric isocyanate compound (1) (50% by mass).

Polyhydric phenol compound (1)

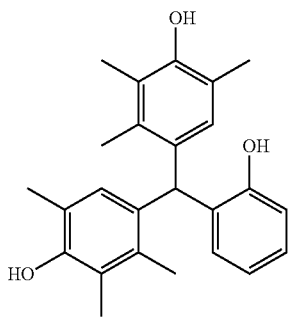

<Preparation of Micro Gel (1)>

Oil-phase components described below and a water-phase component described below were mixed together and emulsified at 12,000 rpm for 10 minutes using a homogenizer. The obtained emulsion was stirred at 45° C. for four hours, an aqueous solution of 10% by mass of 1,8-diazabicyclo[5.4.0]undec-7-ene-octanoic acid salt (U-CAT SA102, manufactured by San-Apro Ltd.) (5.20 g) was added thereto, and the components were stirred at room temperature for 30 minutes and left to stand at 45° C. for 24 hours. Adjustment was made using distilled water so that the concentration of the solid content reached 20% by mass, thereby obtaining a water dispersion liquid of a micro gel (1). The average particle diameter was measured by a light scattering method and found out to be 0.28 μm.

(Oil-Phase Components)

| | |
|---|---|
| (Component 1) Ethyl acetate: | 12.0 g |
| (Component 2) An adduct obtained by adding trimethylolpropane (6 mol) and xylene diisocyanate (18 mol) and adding methyl terminal polyoxy ethylene (1 mol, the number of the oxyethylene unit repeated: 90) thereto (a solution of 50% by mass of ethyl acetate, manufactured by Mitsui Chemicals Inc.): | 3.76 g |
| (Component 3) Polyhydric isocyanate compound (1) (as a solution of 50% by mass of ethyl acetate): | 15.0 g |
| (Component 4) An ethyl acetate solution of 65% by mass of dipentaerythritol pentaacrylate (SR-399, Sartomer Japan Inc.): | 11.54 g |
| (Component 5) An ethyl acetate solution of 10% by mass of a sulfonate-type surfactant (BIONINE A-41-C, manufactured by Takemoto Oil & Fat Co., Ltd.): | 4.42 g |
| (Water-Phase Component) Distilled water: | 46.87 g |

<Formation of Image-Recording Layer (2)>

A coating fluid for an image-recording layer having the following composition was applied onto the support by means of bar coating and dried in an oven at 94° C. for 60 seconds, thereby forming an image-recording layer having a dried coating amount of 0.85 g/m².

<Coating Fluid for Image-Recording Layer (2)>

| | |
|---|---|
| Polymerizable compound*1 | 0.325 parts |
| Graft copolymer 1*2 | 0.060 parts |
| Graft copolymer 2*3 | 0.198 parts |
| Mercapto-3-triazole*4 | 0.180 parts |
| Irgacure 250*5 | 0.032 parts |
| Infrared absorber 1 (illustrated below) | 0.007 parts |
| Sodium tetraphenylborate (illustrated below) | 0.040 parts |
| Klucel 99M*6 | 0.007 parts |
| Byk 336*7 | 0.015 parts |
| Specific low-molecular-weight compound [a compound shown in Table 1] | [Amount shown in Table 1] |
| n-Propanol | 7.470 parts |
| Water | 1.868 parts |

*1The polymerizable compound 1 is dipentaerythritol hexaacrylate (manufactured by Shin-Nakamura Chemical Co., Ltd.).
*2The graft polymer 1 is a polymer grafted by poly(oxy-1,2-ethanediy1), α-(2-methyl-1-oxo-2-propenyl)-ω-methoxy-, and ethenyl benzene and is a dispersion of 25% of this polymer in a solvent of 80% of n-propanol and 20% of water.
*3The graft polymer 2 is a polymer particle of a graft copolymer of poly(ethylene glycol) methyl ether methacrylate, styrene, and acrylonitrile (10:9:81) and is a dispersion containing 24% by mass of this polymer particle in a solvent of n-propanol and water in a mass ratio of 80/20. The volume-average particle diameter of the polymer particles is 193 nm.
*4Mercapto-3-triazole is 3-mercapto-1H,2,4,-triazole that can be procured from PCAS (France).
*5Irgacure 250 is a 75% propylene carbonate solution of iodonium (4-methylphenyl)[4-(2-methylpropyl)phenyl] hexafluorophosphate that can be procured from Ciba Specialty Chemicals Inc.
*6Klucel 99M is a 1% aqueous solution of a hydroxypropyl cellulose viscosity improver that can be procured from Hercules Incorporated.
*7Byk 336 is a 25% xylene/methoxypropyl acetate solution of a modified dimethyl polysiloxane copolymer that can be procured from Byk Chemie.

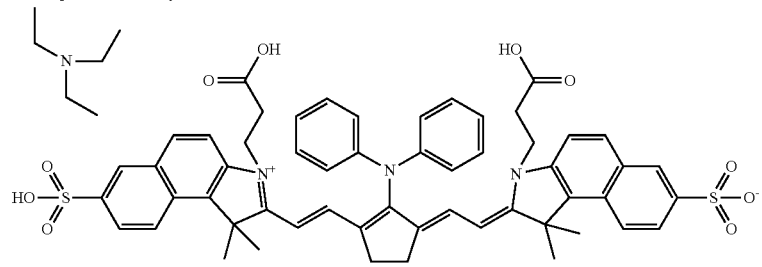

Infrared absorber 1

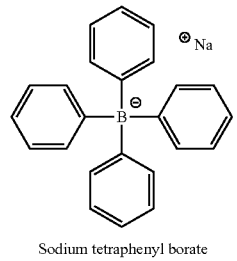 [SMILES: c1ccc([B-](c2ccccc2)(c2ccccc2)c2ccccc2)cc1 ; [Na+] ; "Sodium tetraphenyl borate"]

Sodium tetraphenyl borate

<Formation of Protective Layer>

A coating fluid for a protective layer having the following composition was applied onto the image-recording layer by means of bar coating and dried in an oven at 120° C. for 60 seconds, thereby forming a protective layer having a dried coating amount of 0.15 g/m² and thus producing a lithographic printing plate precursor.

<Coating Fluid for Protective Layer>

| | |
|---|---|
| Inorganic lamellar compound dispersion liquid (1) (described below) | 1.5 parts |
| 6% By mass aqueous solution of polyvinyl alcohol (CKS50 manufactured by The Nippon Synthetic Chemical Industry Co., Ltd., sulfonic acid-modified, degree of saponification of 99% by mol or higher, degree of polymerization of 300) | 0.55 parts |
| 6% By mass aqueous solution of polyvinyl alcohol (PVA-405 manufactured by Kuraray Co., Ltd., degree of saponification of 81.5% by mol, degree of polymerization of 500) | 0.03 parts |
| 1% By mass aqueous solution of a surfactant (polyoxyethylene lauryl ether, EMALEX 710, manufactured by Nihon Emulsion Co., Ltd.) | 0.86 parts |
| Ion exchange water | 6.0 parts |

A method for preparing the inorganic lamellar compound dispersion liquid (1) used for the coating fluid for a protective layer will be described below.

<Preparation of Inorganic Lamellar Compound Dispersion Liquid (1)>

Synthetic mica (SOMASIF ME-100 manufactured by Co-op Chemical Co., Ltd.) (6.4 g) was added to ion exchange water (193.6 g) and was dispersed using a homogenizer until the average particle diameter (the laser scattering method) reached 3 μm. The aspect ratio of the obtained dispersed particle was 100 or higher.

[Production of Lithographic Printing Plate Precursor]

The support and the image-recording layer were combined together as shown in Table 1, thereby producing a lithographic printing plate precursor. The protective layer was formed on the image-recording layer (1), but the protective layer was not formed on the image-recording layer (2).

In lithographic printing plate precursors of Comparative Examples 1 and 2, the image-recording layer was not dried after being applied, and an aqueous solution of the specific low-molecular-weight compound was applied using 2NL04 manufactured by Heishin Ltd. as an applicator. That is, the clearance of the applicator was fixed to 0.3 mm, and the aqueous solution of the specific low-molecular-weight compound was applied to a location 3 cm apart from the end portion in a 6 mm width so that the content of the specific low-molecular-weight compound reached a content shown in Table 1 by adjusting the amount of the aqueous solution sent. After that, the aqueous solution was dried in an oven at 100° C. for 60 seconds.

A polymer PE used for the image-recording layer of a lithographic printing plate precursor of Comparative Example 3 was acid phosphoxypolyoxyethylene glycol monomethacrylate (the number of time of repetition of oxy ethylene: 4 or 5).

[Cutting of Lithographic Printing Plate Precursor]

The lithographic printing plate precursor was cut using rotary blades as illustrated in FIG. 2 by adjusting the gap between the upper side cutting blade and the lower side cutting blade, the jamming amount, the blade tip angle, or the like, thereby forming a shear droop shape having a shear droop amount of 50 μm and a shear droop width of 150 μm. The lithographic printing plate precursors of the comparative examples were cut around a 6 mm-wide region to which the aqueous solution of the specific low-molecular-weight compound was applied, thereby obtaining lithographic printing plate precursors having a 3 mm-wide specific low-molecular-weight compound-applied region in the end portion.

The area ratio of a crack present on the surface of the anode oxide film in a region corresponding to the shear droop width Y was computed according to the above-described method and was found out to be 13% in the support (1), 8% in the support (2), and 6% in the supports (3) and (4).

[Evaluation of Lithographic Printing Plate Precursor]

For the lithographic printing plate precursors, the edge contamination-preventing property, the image-forming property of the end portion, and the on-machine developability were evaluated as described below.

<Edge Contamination-Preventing Property>

The lithographic printing plate precursor was exposed using a Luxcel PLATESETTER T-6000111 manufactured by Fujifilm Corporation equipped with an infrared semiconductor laser under conditions of an external surface drum rotation speed of 1,000 rpm, a laser output of 70%, and a resolution of 2,400 dpi. An exposed image was provided with a solid image and a 50% halftone dot chart including a non-image area.

The image-exposed lithographic printing plate precursor was mounted in a web offset press manufactured by Tokyo Kikai Seisakusho, Ltd., printing was carried out on newsprint paper at a speed of 100,000 pieces per hour using SOYBI KKST-S (red) manufactured by The Inctec Inc. as newspaper printing ink and TOYO ALKY manufactured by Toyo Ink Co., Ltd. as dampening water, the 1,000$^{th}$ printed matter was sampled from scumming-eliminated water scales at a 1.5-time water scale, and the degree of linear contamination arising from the end portion of the lithographic printing plate precursor was evaluated using the following standards.

5: Not Contaminated
4: An intermediate level between 5 and 3
3: slightly contaminated, but an allowable level
2: An intermediate level between 3 and 1 (allowable level)
1: Clearly contaminated and a non-allowable level <Image-Forming Property of End Portion>

The image-exposed lithographic printing plate precursor was mounted in a web offset press manufactured by Tokyo Kikai Seisakusho, Ltd. in the same manner as in the evaluation of the edge contamination-preventing property, printing was carried out on newsprint paper at a speed of 100,000 pieces per hour using SOYBI KKST-S (red) manufactured by The Inctec Inc. as newspaper printing ink and ECO SEVEN N-1 manufactured by Sakata Inx Corporation as dampening water, the $1,000^{th}$, $10,000^{th}$, $50,000^{th}$, and $100,000^{th}$ printed matters were sampled, and the image-forming properties in a region 1 mm wide inward from the end portion of the lithographic printing plate precursor was evaluated using the following standards.

5: An image can be printed even after the printing of the $100,000^{th}$ piece.
4: An image can be printed even after the printing of the $50,000^{th}$ piece.
3: An image can be printed even after the printing of the $10,000^{th}$ piece.
2: An image can be printed even after the printing of the $1,000^{th}$ piece.
1: An image cannot be printed after the printing of the $1,000^{th}$ piece.

<On-Machine Developability>

The image-exposed lithographic printing plate precursor was mounted in a web offset press manufactured by Tokyo Kikai Seisakusho, Ltd. in the same manner as in the evaluation of the edge contamination-preventing property, and printing was carried out on newsprint paper at a speed of 100,000 pieces per hour using SOYBI KKST-S (red) manufactured by The Inctec Inc. as newspaper printing ink and ECO SEVEN N-1 manufactured by Sakata Inx Corporation as dampening water. The number of pieces of newsprint paper necessary to complete the on-machine development of a non-exposed portion in the image-recording layer on the printer in a region 50 mm wide inward from the end portion of the lithographic printing plate precursor and form a state in which the ink was not transferred to the non-image area was measured as the number of on-machine developed pieces and was evaluated using the following standards.

5: The number of on-machine developed pieces is 25 or less.
4: The number of on-machine developed pieces is 26 to 30.
3: The number of on-machine developed pieces is 31 to 35.
2: The number of on-machine developed pieces is 36 to 40.
1: The number of on-machine developed pieces is 100 or more, which is a non-allowable level.

The evaluation results are shown in Table 1. In Table 1, in a case in which the content of the specific low-molecular-weight compound is shown as numeric values including "/", a numeric value on the left side of "/" represents the content of the specific low-molecular-weight compound in the end portion, and a numeric value on the right side of "/" represents the content of the specific low-molecular-weight compound in a region other than the end portion. For example, "10/0" for Comparative Example 1 indicates that the content of phosphoric acid in the end portion is 10 mg/m² and the content of phosphoric acid in the region other than the end portion is 0 mg/m².

TABLE 1

| | Support | Image-recording layer | Specific low-molecular-weight compound or comparative compound | | Edge contamination-preventing property | Image-forming property of end portion | On-machine developability |
|---|---|---|---|---|---|---|---|
| | | | Kind | Content (mg/m²) | | | |
| Example 1 | (1) | (1) | Phosphoric acid | 20 | 5 | 5 | 5 |
| Example 2 | (1) | (1) | Phosphoric acid | 30 | 3 | 5 | 5 |
| Example 3 | (1) | (1) | Phosphoric acid | 60 | 4 | 5 | 5 |
| Example 4 | (1) | (1) | Phosphoric acid | 100 | 5 | 5 | 4 |
| Example 5 | (1) | (1) | Phosphoric acid | 150 | 5 | 4 | 3 |
| Example 6 | (1) | (1) | Phosphoric acid | 68 | 5 | 5 | 5 |
| Example 7 | (2) | (1) | Phosphoric acid | 20 | 4 | 5 | 5 |
| Example 8 | (3) | (1) | Phosphoric acid | 20 | 5 | 5 | 5 |
| Example 9 | (1) | (1) | Polyphosphoric acid | 20 | 3 | 5 | 5 |
| Example 10 | (1) | (1) | Polyphosphoric acid | 60 | 5 | 5 | 5 |
| Example 11 | (1) | (1) | Polyphosphoric acid | 150 | 5 | 4 | 3 |
| Example 12 | (4) | (2) | Polyphosphoric acid | 20 | 4 | 5 | 4 |
| Example 13 | (4) | (2) | Polyphosphoric acid | 60 | 5 | 5 | 4 |
| Example 14 | (4) | (2) | Polyphosphoric acid | 150 | 5 | 4 | 3 |
| Example 15 | (1) | (1) | Citric acid | 60 | 5 | 5 | 4 |
| Example 16 | (1) | (1) | p-Toluenesulfonic acid | 60 | 5 | 5 | 4 |
| Example 17 | (1) | (1) | Phosphonic acid | 60 | 5 | 5 | 4 |
| Example 18 | (1) | (1) | Phosphinic acid | 60 | 5 | 5 | 4 |
| Example 19 | (1) | (1) | Sulfophthalic acid | 60 | 5 | 5 | 4 |
| Example 20 | (1) | (1) | sodium dihydrogen phosphate | 60 | 5 | 5 | 4 |
| Example 21 | (1) | (1) | Sodium p-toluenesulfonate | 60 | 5 | 5 | 4 |
| Comparative Example 1 | (1) | (1) | Phosphoric acid | 8/0 | 1 | 5 | 4 |
| Comparative Example 2 | (1) | (1) | Phosphoric acid | 200/60 | 5 | 1 | 4 |

TABLE 1-continued

|  | Support | Image-recording layer | Specific low-molecular-weight compound or comparative compound | | Edge contamination-preventing property | Image-forming property of end portion | On-machine developability |
|---|---|---|---|---|---|---|---|
|  |  |  | Kind | Content (mg/m$^2$) |  |  |  |
| Comparative Example 3 | (1) | (1) | Hosuma PE | 100 | 3 | 5 | 1 |

From the results shown in Table 1, it is found that, in the lithographic printing plate precursors containing substantially the same amount of the specific low-molecular-weight compound according to the present invention in the plane of the image-recording layer, edge contamination is prevented without degrading the characteristics such as the image-forming property of the end portion and the on-machine developability. In contrast, in the lithographic printing plate precursors of Comparative Examples 1 and 2 in which the content of the specific low-molecular-weight compound varies in the plane of the image-recording layer, clear edge contamination was caused, and the image-forming property of the end portion deteriorated. In addition, the polymer PE used in the lithographic printing plate precursor of Comparative Example 3 had a phosphoric acid group having a support adsorptive property and had a molecular weight of 1,000 or less, but had a phosphoric acid group having a methacrylic group that is an unsaturated double bond group and thus cured during the exposure together with the image-recording layer, and consequently, there was a problem in that the on-machine developability deteriorated. As described above, in Comparative Examples 1 to 3, it is found that it was not possible to satisfy all of the edge contamination-preventing property, the image-forming property of the end portion, and the on-machine developability.

Examples 31 to 56 and Comparative Examples 31 and 32

<Production of Support (5)>

A support (5) was produced in the same manner as in the production of the support (1) except for the fact that, in the production of the support (1), the anodization process (f) and the pore widening process (g) were changed as described below.

(f1) First Anodization Process

A 15% by mass sulfuric acid aqueous solution was used as the electrolytic solution, and an anodization process was carried out under conditions of 50° C. and a current density of 30 A/dm$^2$. After that, water washing was carried out by spraying.

(g) Pore widening process

An alkali process was carried out on the aluminum plate using a NaOH 5% aqueous solution at 40° C. for three seconds. After that, water washing was carried out by spraying.

(f2) Second Anodization Process

An anodization process was carried out under conditions of 50° C. and a current density of 30 A/dm$^2$ using a 15% by mass sulfuric acid aqueous solution as the electrolytic solution. After that, water washing was carried out by spraying, and.

The thickness of the anode oxide film on the support (5) was 1,000 nm. Micropores in the anode oxide film in the support (5) were constituted of large-diameter pore portions and small-diameter pore portions, and the depth of the large-diameter pore portion, the average diameter of the large-diameter pore portions, the depth of the small-diameter pore portion, and the average diameter of the small-diameter pore portions at a communication location were respectively 100 nm, 30 nm, 900 nm, and 10 nm. The value of brightness L* of the surface of the anode oxide film was 82, and the steepness a45 was 23%.

<Production of Support (6)>

A support (6) was produced in the same manner as in the production of the support (1) except for the fact that, in the production of the support (1), the anodization process (f) was changed as described below and the pore widening process (g) was not carried out.

(f1) First Anodization Process

An anodization process was carried out under conditions of 35° C. and a current density of 4.5 A/dm$^2$ using a 13% by mass phosphoric acid aqueous solution as the electrolytic solution. After that, water washing was carried out by spraying.

(f2) Second Anodization Process

An anodization process was carried out under conditions of 35° C. and a current density of 4.5 A/dm$^2$ using a 13% by mass phosphoric acid aqueous solution as the electrolytic solution. After that, water washing was carried out by spraying, and.

The thickness of the anode oxide film on the support (6) was 1,000 nm, and the average diameter of micropores in the anode oxide film was 40 nm. The value of brightness L* of the surface of the anode oxide film was 83, and the steepness a45 was 23%.

<Production of Support (7)>

A support (7) was produced in the same manner as in the production of the support (1) except for the fact that, in the production of the support (1), the anodization process (f) was changed as described below and the pore widening process (g) was not carried out.

(f1) First Anodization Process

An anodization process was carried out under conditions of 35° C. and a current density of 4.5 A/dm$^2$ using a 13% by mass phosphoric acid aqueous solution as the electrolytic solution. After that, water washing was carried out by spraying.

(f2) Second Anodization Process

An anodization process was carried out under conditions of 50° C. and a current density of 13 A/dm$^2$ using a 15% by mass sulfuric acid aqueous solution as the electrolytic solution. After that, water washing was carried out by spraying, and.

The thickness of the anode oxide film on the support (7) was 1,000 nm, and the average diameter of micropores in the anode oxide film was 40 nm. The value of brightness L* of the surface of the anode oxide film was 83, and the steepness a45 was 23%.

<Production of Support (8)>

A support (8) was produced in the same manner as in the production of the support (1) except for the fact that, in the production of the support (1), the anodization process (f) and the pore widening process (g) were changed as described below.

(f1) Anodization Process

An anodization process was carried out under conditions of 20° C. and a current density of 15 A/dm² using a 3% by mass sulfuric acid aqueous solution as the electrolytic solution. After that, water washing was carried out by spraying.

(g) Pore Widening Process

An alkali process was carried out on the aluminum plate using a NaOH 5% aqueous solution at 30° C. for seven seconds. After that, water washing was carried out by spraying.

The thickness of the anode oxide film on the support (8) was 1,000 nm, and the average diameter of micropores in the anode oxide film was 60 nm. The value of brightness L* of the surface of the anode oxide film was 85, and the steepness a45 was 23%.

<Production of Support (9)>

A support (9) was produced in the same manner as in the production of the support (1) except for the fact that, in the production of the support (1), the anodization process (f) was changed as described below and the pore widening process (g) was not carried out.

(f1) Anodization Process

An anodization process was carried out under conditions of 38° C. and a current density of 5 A/dm² using an 18% by mass phosphoric acid aqueous solution as the electrolytic solution. After that, water washing was carried out by spraying.

The thickness of the anode oxide film on the support (9) was 1,000 nm, and the average diameter of micropores in the anode oxide film was 15 nm. The value of brightness L* of the surface of the anode oxide film was 83, and the steepness a45 was 23%.

<Production of Support (10)>

A support (10) was produced in the same manner as in the production of the support (1) except for the fact that, in the production of the support (1), the anodization process (f) was changed as described below and the pore widening process (g) was not carried out.

(f1) Anodization Process

An anodization process was carried out under conditions of 38° C. and a current density of 30 A/dm² using an 18% by mass phosphoric acid aqueous solution as the electrolytic solution. After that, water washing was carried out by spraying.

The thickness of the anode oxide film on the support (10) was 1,000 nm, and the average diameter of micropores in the anode oxide film was 60 nm. The value of brightness L* of the surface of the anode oxide film was 87, and the steepness a45 was 23%.

<Formation of Under Layer of Image-Recording Layer>

A coating fluid for a under layer of the image-recording layer having the following composition was applied on to the support by means of bar coating and was dried in an oven at 100° C. for 30 seconds, thereby forming a under layer of the image-recording layer in which the coating amount of the specific low-molecular-weight compound was 90 mg/m².

(Coating Fluid for Under Layer of Image-Recording Layer)

| | |
|---|---:|
| Specific low-molecular-weight compound [compound shown in Table 2] | [Amount shown in Table 2] |
| Polymer (P) [the following structure] | 10 parts |
| Chelating agent (CHELEST 3EAF, manufactured by Chelest Corporation) | 5 parts |
| Chelating agent (CHELEST 400, manufactured by Chelest Corporation) | 5 parts |
| Surfactant (EMALEX 710, manufactured by Nihon Emulsion Co., Ltd.) | 3 parts |
| Water | 3,000 parts |

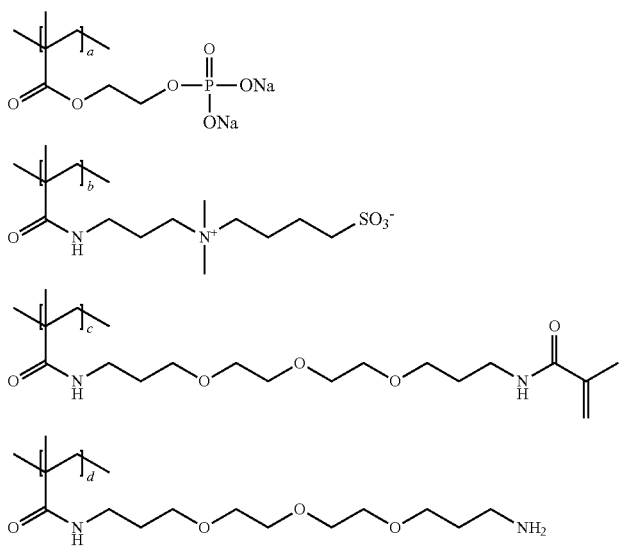

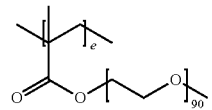

a/b/c/d/e = 12.9/72.1/9.0/1.0/5.0 (wt %)
a/b/c/d/e = 18.8/72.2/7.7/0.9/0.4 (mol %)
Polymer (P)

<Formation of Upper Layer (1) of Image-Recording Layer>

An upper layer (1) of the image-recording layer was formed in the same manner as in the formation of the image-recording layer (1) except for the fact that, in the formation of the image-recording layer (1), the specific low-molecular-weight compound or the comparative compound in the photosensitive liquid (1) was not used.

<Formation of Upper Layer (2) of Image-Recording Layer>

An upper layer (2) of the image-recording layer was formed in the same manner as in the formation of the image-recording layer (2) except for the fact that, in the formation of the image-recording layer (2), the specific low-molecular-weight compound was not used.

[Production of Lithographic Printing Plate Precursor]

The support, the under layer of the image-recording layer, and the upper layer of the image-recording layer were combined together as shown in Table 2, thereby producing a lithographic printing plate precursor. The protective layer was formed on the upper layer (1) of the image-recording layer, but the protective layer was not formed on the upper layer (2) of the image-recording layer.

In lithographic printing plate precursor of Comparative Example 32, the under layer of the image-recording layer was not dried after being applied, and an aqueous solution of the specific low-molecular-weight compound was applied using 2NL04 manufactured by Heishin Ltd. as an applicator. That is, the clearance of the applicator was fixed to 0.3 mm, and the aqueous solution of the specific low-molecular-weight compound was applied to a location 3 cm apart from the end portion in a 6 mm width so that the content of the specific low-molecular-weight compound reached a content shown in Table 2 by adjusting the amount of the aqueous solution sent. After that, the aqueous solution was dried in an oven at 100° C. for 60 seconds.

[Cutting of Lithographic Printing Plate Precursor]

The lithographic printing plate precursor was cut using rotary blades as illustrated in FIG. 2 by adjusting the gap between the upper side cutting blade and the lower side cutting blade, the jamming amount, the blade tip angle, or the like, thereby forming a shear droop shape having a shear droop amount of and a shear droop width shown in Table 2 in the end portion. The lithographic printing plate precursor of Comparative Example 32 was cut around a 6 mm-wide region to which the aqueous solution of the specific low-molecular-weight compound was applied, thereby obtaining a lithographic printing plate precursor having a 3 mm-wide specific low-molecular-weight compound-applied region in the end portion.

[Evaluation of Lithographic Printing Plate Precursor]

For the lithographic printing plate precursors, the edge contamination-preventing property, the image-forming property of the end portion, and the on-machine developability were evaluated in the same manner as in Example 1.

The evaluation results are shown in Table 2. In Table 2, the polyphosphoric acid in the specific low-molecular-weight compound was a trimer and had a molecular weight of 256. CHELEST PH-210 was manufactured by Chelest Corporation and had a molecular weight of 206. In a case in which the content of the specific low-molecular-weight compound is shown as numeric values including "/", a numeric value on the left side of "/" represents the content of the specific low-molecular-weight compound in the end portion, and a numeric value on the right side of "/" represents the content of the specific low-molecular-weight compound in a region other than the end portion. "90/0" for Comparative Example 32 indicates that the content of phosphoric acid in the end portion is 90 mg/m$^2$ and the content of phosphoric acid in the region other than the end portion is 0 mg/m$^2$.

TABLE 2

| | Specific low-molecular-weight compound or comparative compound | | | | Shear droop shape | | | Edge contamination-preventing property | Image-forming property of end portion | On-machine developability |
|---|---|---|---|---|---|---|---|---|---|---|
| | Support | Kind | Content (mg/m$^2$) | Amount of element derived from support adsorptive group (% by mass) | Upper layer of image-recording layer | shear droop amount X (μm) shear droop width Y (μm) | Area ratio of crack (%) | | | |
| Example 31 | (7) | Phosphoric acid | 90 | 5 | (1) | 60/180 | 7 | 5 | 5 | 5 |
| Example 32 | (5) | Phosphoric acid | 90 | 5 | (1) | 60/180 | 7 | 5 | 5 | 5 |
| Example 33 | (6) | Phosphoric acid | 90 | 5 | (1) | 60/180 | 7 | 5 | 5 | 5 |
| Example 34 | (7) | Phosphoric acid | 90 | 5 | (2) | 60/180 | 7 | 5 | 5 | 4 |
| Example 35 | (7) | Phosphoric acid | 90 | 5 | (1) | 25/75 | 5 | 3 | 5 | 5 |
| Example 36 | (7) | Phosphoric acid | 90 | 5 | (1) | 45/135 | 6 | 4 | 5 | 5 |
| Example 37 | (7) | Phosphoric acid | 90 | 5 | (1) | 100/300 | 20 | 3 | 5 | 5 |
| Example 38 | (7) | Phosphoric acid | 90 | 5 | (1) | 150/450 | 35 | 2 | 5 | 5 |
| Example 39 | (7) | Phosphoric acid | 10 | 0.5 | (1) | 60/180 | 7 | 2 | 5 | 5 |
| Example 40 | (7) | Phosphoric acid | 45 | 2.5 | (1) | 60/180 | 7 | 4 | 5 | 5 |
| Example 41 | (7) | Phosphoric acid | 120 | 6.5 | (1) | 60/180 | 7 | 5 | 5 | 4 |
| Example 42 | (7) | Phosphoric acid | 150 | 8.2 | (1) | 60/180 | 7 | 5 | 4 | 3 |

TABLE 2-continued

| | Support | Specific low-molecular-weight compound or comparative compound | | | Upper layer of image-recording layer | Shear droop shape | | | Edge contamination-preventing property | Image-forming property of end portion | On-machine developability |
|---|---|---|---|---|---|---|---|---|---|---|---|
| | | Kind | Content (mg/m²) | Amount of element derived from support adsorptive group (% by mass) | | shear droop amount X (μm) shear droop width Y (μm) | Area ratio of crack (%) | | | | |
| Example 43 | (7) | Sodium dihydrogen phosphate | 90 | 5 | (1) | 60/180 | 7 | | 5 | 5 | 5 |
| Example 44 | (7) | Trisodium phosphate | 90 | 5 | (1) | 60/180 | 7 | | 5 | 5 | 5 |
| Example 45 | (7) | Polyphosphoric acid | 90 | 5 | (1) | 60/180 | 7 | | 5 | 5 | 5 |
| Example 46 | (7) | Phosphonic acid | 90 | 5 | (1) | 60/180 | 7 | | 5 | 5 | 5 |
| Example 47 | (7) | Phosphinic acid | 90 | 5 | (1) | 60/180 | 7 | | 5 | 5 | 5 |
| Example 48 | (7) | Phytic acid | 90 | 5 | (1) | 60/180 | 7 | | 5 | 5 | 5 |
| Example 49 | (7) | CHELEST PH-210 | 90 | 5 | (1) | 60/180 | 7 | | 5 | 5 | 5 |
| Example 50 | (7) | Citric acid | 90 | 5 | (1) | 60/180 | 7 | | 4 | 5 | 5 |
| Example 51 | (7) | p-Toluenesulfonic acid | 90 | 5 | (1) | 60/180 | 7 | | 4 | 5 | 5 |
| Example 52 | (7) | Sulfophthalic acid | 90 | 5 | (1) | 60/180 | 7 | | 4 | 5 | 5 |
| Example 53 | (1) | Phosphoric acid | 90 | 5 | (1) | 60/180 | 7 | | 5 | 5 | 5 |
| Example 54 | (8) | Phosphoric acid | 90 | 5 | (1) | 60/180 | 7 | | 5 | 5 | 5 |
| Example 55 | (9) | Phosphoric acid | 90 | 5 | (1) | 60/180 | 7 | | 5 | 5 | 5 |
| Example 56 | (10) | Phosphoric acid | 90 | 5 | (1) | 60/180 | 7 | | 5 | 5 | 5 |
| Comparative Example 31 | (7) | — | 0 | 0 | (1) | 60/180 | 7 | | 1 | 5 | 5 |
| Comparative Example 32 | (7) | Phosphoric acid | 90/0 | 5/0 | (1) | 60/180 | 7 | | 5 | 1 | 5 |

From the results shown in Table 2, it is found that, in the lithographic printing plate precursors containing substantially the same amount of the specific low-molecular-weight compound according to the present invention in the plane of the image-recording layer, edge contamination is prevented without degrading the characteristics such as the image-forming property of the end portion and the on-machine developability. In contrast, in the lithographic printing plate precursor of Comparative Example 31 in which the upper layer of the image-recording layer and the under layer of the image-recording layer did not contain the specific low-molecular-weight compound, clear edge contamination was caused, and, in the lithographic printing plate precursor of Comparative Example 32 in which the content of the specific low-molecular-weight compound varied in the plane of the image-recording layer, the image-forming property of the end portion deteriorated. As described above, it is found that, in the lithographic printing plate precursors of the comparative examples, it was not possible to satisfy all of the edge contamination-preventing property, the image-forming property of the end portion, and the on-machine developability.

According to the present invention, it is possible to provide an on-machine development-type lithographic printing plate precursor in which edge contamination is prevented without degrading the characteristics such as the image-forming property of the end portion and on-machine developability and a method for producing a lithographic printing plate in which the on-machine development-type lithographic printing plate precursor is used.

The present invention has been described in detail with reference to specific embodiments, but it is clear to a person skilled in the related art that a variety of modifications or corrections can be added thereto within the concept and scope of the present invention.

The present application claims priority on the basis of a Japanese patent application filed on Aug. 30, 2017 (JP2017-165908), a Japanese patent application filed on May 2, 2018 (JP2018-088781), and a Japanese patent application filed on Jul. 30, 2018 (JP2018-142869), the contents of which are incorporated herein by reference.

EXPLANATION OF REFERENCES

1: lithographic printing plate precursor
1a: image-recording layer
1b: support surface
1c: end surface
2: shear droop
X: shear droop amount
Y: shear droop width
B: boundary between image-recording layer surface and support
10: cutting blade
10a: upper side cutting blade
10b: upper side cutting blade
11: rotary shaft
20: cutting blade
20a: lower side cutting blade
20b: lower side cutting blade
21: rotary shaft

What is claimed is:
1. An on-machine development lithographic printing plate precursor comprising:
an image-recording layer on an aluminum support having an anode oxide film,
wherein an end portion of the lithographic printing plate precursor has a shear droop shape, the image-recording layer contains a compound having a support adsorptive property, having a molecular weight of 1,000 or less, and not having an ethylenic unsaturated group in a molecule of the compound, and a content of the compound is substantially same in a plane of the image-recording layer, a content of the compound at a central portion and a content of the compound at an end portion of the lithographic printing plate precursor are the same, and wherein the compound is a phosphoric acid, a polyphosphoric acid, a phosphonic acid, or a phosphinic acid.

2. The on-machine development lithographic printing plate precursor according to claim 1, wherein a content of the compound is 10 to 150 mg/m$^2$.

3. The on-machine development lithographic printing plate precursor according to claim 1, wherein the shear droop shape has a shear droop amount X of 25 to 150 μm and a shear droop width Y of 70 to 300 μm.

4. The on-machine development lithographic printing plate precursor according to claim 3, wherein an area ratio of a crack present on a surface of the anode oxide film in a region corresponding to the shear droop width Y of the lithographic printing plate precursor is 10% or less.

5. The on-machine development lithographic printing plate precursor according to claim 4, wherein the area ratio of the crack is 6% or less.

6. The on-machine development lithographic printing plate precursor according to claim 1, wherein the image-recording layer contains a polymer particle.

7. The on-machine development lithographic printing plate precursor according to claim 6, wherein the polymer particle is a particle of a polymer including at least one of a monomer unit derived from a styrene compound and a monomer unit derived from a (meth)acrylonitrile compound.

8. The on-machine development lithographic printing plate precursor according to claim 1, wherein the image-recording layer contains a polymerization initiator, an infrared absorber, and a polymerizable compound.

9. An on-machine development lithographic printing plate precursor comprising:

an image-recording layer on an aluminum support having an anode oxide film, wherein an end portion of the lithographic printing plate precursor has a shear droop shape, the image-recording layer contains a compound having a support adsorptive property, having a molecular weight of 1,000 or less, and not having an ethylenic unsaturated group in a molecule of the compound, a content of the compound is substantially same in a plane of the image-recording layer, a content of the compound at a central portion and a content of the compound at an end portion of the lithographic printing plate precursor are the same, and, in a case of linearly analyzing a cross section of the lithographic printing plate precursor in a depth direction using STEM-EDS, 0.5% by mass or more of an element derived from the support-adsorptive group is present at any depth toward a side of the image-recording layer side from an interface between the aluminum support and the image-recording layer, and wherein the compound is a phosphoric acid, a polyphosphoric acid, a phosphonic acid, or a phosphinic acid.

10. The on-machine development lithographic printing plate precursor according to claim 1, wherein a value of brightness L* in a CIEL*a*b* color system of a surface of the anode oxide film at a side of the image-recording layer is 70 to 100.

11. The on-machine development lithographic printing plate precursor according to claim 9, wherein a value of brightness L* in a CIEL*a*b* color system of a surface of the anode oxide film at a side of the image-recording layer is 70 to 100.

12. The on-machine development lithographic printing plate precursor according to claim 1, wherein a steepness a45 of a component having a wavelength of 0.2 to 2 μm on a surface of the anode oxide film at a side of the image-recording layer is 30% or less.

13. The on-machine development lithographic printing plate precursor according to claim 9, wherein a steepness a45 of a component having a wavelength of 0.2 to 2 μm on a surface of the anode oxide film at a side of the image-recording layer is 30% or less.

14. The on-machine development lithographic printing plate precursor according to claim 1, wherein micropores are present on a surface of the anode oxide film, and an average diameter of the micropores on the surface of the anode oxide film is 10 to 100 nm.

15. The on-machine development lithographic printing plate precursor according to claim 9, wherein micropores are present on a surface of the anode oxide film, and an average diameter of the micropores on the surface of the anode oxide film is 10 to 100 nm.

16. The on-machine development lithographic printing plate precursor according to claim 14, wherein the micropore is constituted of large-diameter pore portions extending up to a location of 10 to 1,000 nm deep from the surface of the anode oxide film and small-diameter pore portions that communicate with a bottom portion of the large-diameter pore portion and extend up to a location of 20 to 2,000 nm deep from a location of the communicating, and an average diameter of the small-diameter pore portions is 5% to 80% of an average diameter of the large-diameter pore portions.

17. A method for producing a lithographic printing plate comprising:

image-exposing the on-machine development lithographic printing plate precursor according to claim 1 with an infrared laser; and removing a non-exposed portion of the image-recording layer with at least one selected from printing ink and dampening water on a printer.

* * * * *